United States Patent
Dono et al.

(10) Patent No.: US 6,538,924 B2
(45) Date of Patent: Mar. 25, 2003

(54) SEMICONDUCTOR INTEGRATED CIRCUIT

(75) Inventors: Chiaki Dono, Hachiouji (JP); Tsugio Takahashi, Hachiouji (JP); Hiroki Fujisawa, Sagamihara (JP); Masanori Isoda, Sayama (JP)

(73) Assignees: Hitachi, Ltd., Tokyo (JP); Hitachi ULSI Systems Co., Ltd., Kodaira (JP)

( * ) Notice: Subject to any disclaimer, the term of this patent is extended or adjusted under 35 U.S.C. 154(b) by 0 days.

(21) Appl. No.: 09/866,628

(22) Filed: May 30, 2001

(65) Prior Publication Data

US 2002/0015328 A1 Feb. 7, 2002

(30) Foreign Application Priority Data

Jun. 30, 2000 (JP) .................................. 2000-199900

(51) Int. Cl.[7] ............................................... G11C 14/00
(52) U.S. Cl. .............. 365/185.08; 365/200; 365/185.09
(58) Field of Search ......................... 365/185.08, 200, 365/185.09

(56) References Cited

U.S. PATENT DOCUMENTS 5,383,161 A * 1/1995 Sanemitsu ............. 365/185.08

FOREIGN PATENT DOCUMENTS

JP 8-31196 2/1996

* cited by examiner

Primary Examiner—Huan Hoang
(74) Attorney, Agent, or Firm—Antonelli, Terry, Stout & Kraus, LLP

(57) ABSTRACT

In a semiconductor integrated circuit including a first storage having memory cells of a first configuration and a second storage having memory cells of a second configuration, according to a first combination (CS, RAS, CAS, and WE="L" and A7="0") of control signals (CS, RAS, CAS, and WE) input to control terminals and at least a part of signals input to address terminals to which an address signal (A7) for selecting a memory cell in the first storage is input, an access to the first storage is instructed. According to a second combination (CS, RAS, CAS, WE="L", and A7="1") of the signals input to the control terminals and at least a part of signals input to the address terminals, an access to the second storage is instructed.

12 Claims, 16 Drawing Sheets

SEMICONDUCTOR INTEGRATED CIRCUIT

BACKGROUND OF THE INVENTION

The present invention relates to a semiconductor integrated circuit technique and, further, to a command control method for use in a semiconductor integrated circuit having therein a plurality of memory circuits. The invention relates to a technique which is effective for use in, for example, enabling repair of a defective bit and in the adjustment of the operation timing of a circuit after a chip is mounted.

Hitherto, in a semiconductor integrated circuit having therein a semiconductor memory, such as a RAM (Random Access Memory) or a memory circuit, in order to improve the yield by repairing a defective bit (defective memory cell) included in a memory array, a redundancy circuit, such as an address setting circuit for storing a spare memory column, a spare memory row and a defect address, is provided. A defect address in such a redundancy circuit is generally set by using a programmable fuse activated by a laser or the like.

In a repairing method involving the steps of blowing a fuse using a laser to store defect address information, comparing an input address with the stored defect address information, and replacing a defective memory row or a defective memory column with a spare memory row or a spare memory column, a fuse has to be blown before the memory chip is sealed in a package. A defect occurring after the memory chip is sealed in the package cannot be repaired, and this causes a problem in that a sufficiently improved yield cannot be achieved.

A technique in which a nonvolatile memory, such as an EEPROM (Electrically Erasable Programmable Read Only Memory), is provided in a chip of a DRAM (Dynamic Random Access Memory) for storing defect address information, has been proposed. According to such a technique, even after a chip is sealed in a package, defect address information can be written into the EEPROM. Consequently, a defect occurring after the chip is sealed in the package can be repaired, so that the yield can be improved.

It was, however, clarified by examination of the inventor of the present invention that the conventionally proposed repairing method using an EEPROM has the following problems. Although defect address information can be written in the EEPROM even after the chip is sealed in the package, in a state where the chip is mounted on a printed wiring board (hereinbelow, called a board), a module, or the like, the defect address information cannot be written. A new control terminal for writing information to the EEPROM and a source terminal for applying a high voltage necessary for writing/erasing information to/from the EEPROM are necessary, and so compatibility with a conventional memory cannot be maintained. The memory repairing method is disclosed in Japanese Unexamined Patent Application Laid-Open No. Hei 8(1996)-31196 and Japanese Patent Application No. Hei 11(1999)-23631 (corresponding to U.S. application Ser. No. 09/493280).

SUMMARY OF THE INVENTION

An object of the invention is to provide a semiconductor integrated circuit having therein a memory circuit, such as a RAM, in which defect address information can be easily written even in a state where a chip is sealed in a package and is further mounted on a board, module, or the like, thereby making it possible to repair a defective bit in the memory circuit and accordingly achieve an improved yield.

Another object of the invention is to provide a semiconductor integrated circuit having therein a memory circuit such as a RAM, in which the operation timing of the circuit is adjusted to increase the operation margin, thereby enabling the circuit to operate at higher speed.

Still another object of the invention is to provide a semiconductor integrated circuit in which a chip can be prevented from losing compatibility with a conventional chip due to an increase in the number of terminals or a different pin arrangement.

The foregoing objects of the invention, other objects, and novel features will become apparent from the description of the specification and the attached drawings.

The outline of representative aspects and features of the invention disclosed in this application will be described as follows.

In a semiconductor integrated circuit comprising: a first storage (11) having a memory cell of a first configuration; a second storage (20) having a memory cell of a second configuration; a plurality of control terminals for receiving a plurality of control signals from the outside; and a plurality of address terminals for receiving a plurality of address signals for selecting a memory cell in the first storage, an operation of the first storage is instructed according to a first combination (CS, RAS, CAS, and WE="L", and A7="0") of the signals (CS, RAS, CAS, and WE) supplied to the control terminals and at least a part (A7) of the signals supplied to the address terminals, and an operation of the second storage is instructed according to a second combination (CS, RAS, CAS, and WE="L", and A7="1") of the signals supplied to the control terminals and at least a part of the signals supplied to the address terminals.

According to the above, the first and second storages having memory cells of different configurations can be accessed by the same command. Consequently, the first and second storages can be separately operated without providing a new external control terminal.

Desirably, the signals supplied to the control terminals in the first combination and those in the second combination are the same, and a signal supplied to the address terminal in the first combination and that in the second combination are different from each other. Consequently, by the signal supplied to the address terminal, the instruction to the first storage and the instruction to the second storage by the same command can be discriminated from each other. Thus, the first and second storages can be operated separately without providing a new external terminal.

In a semiconductor integrated circuit comprising: a first storage having a memory cell of a first configuration; a second storage having a memory cell of a second configuration; a plurality of control terminals for receiving a plurality of control signals from the outside; and a plurality of address terminals for receiving a plurality of address signals for selecting a memory cell in the first storage, a command for instructing an operation of the first storage, which is specified by a combination of the control signals supplied to the control terminals after the operation of the first storage or the operation of the second storage is instructed and a command for instructing the operation of the second storage are the same code. With this configuration, while effectively using the combinations of a relatively small number of control signals, the first and second storages can be operated separately.

Further, in a semiconductor integrated circuit comprising: a first storage having a memory cell of a first configuration; a second storage having a memory cell of a second configuration; a plurality of control terminals for receiving a plurality of control signals from the outside; and a plurality of address terminals for receiving a plurality of address signals for selecting a memory cell in the first storage, an operation of the first storage is instructed according to a first combination of the signals supplied to the control terminals and at least a part of the signals supplied to the address terminals, an operation of the second storage is instructed according to a second combination of the signals supplied to the control terminals and at least a part of the signals supplied to the address terminals, and a command for instructing an operation of the first storage, which is specified by a combination of the control signals supplied to the control terminals after the operation of the first storage or the operation of the second storage is instructed and a command for instructing the operation of the second storage are the same code.

Consequently, since the first and second storages having memory cells of different configurations can be accessed by the same command, the first and second storages can be operated separately without providing a new external control terminal, and the first and second storages can be operated separately while effectively using combinations of a relatively small number of control signals.

In this case as well, desirably, the signals supplied to the control terminals in the first combination and those in the second combination are the same, and the signal (s) supplied to the address terminals) in the first combination and that (those) in the second combination are different from each other. Since the instruction to the first storage and that to the second storage by the same command can be discriminated from each other by the signal supplied to the address terminal, the first and second storages can be operated separately without providing a new external terminal.

Further, preferably, information stored in the second storage is defect address information of the first storage. Since the first an) second storages can be accessed by the same command, even after the chip is sealed in package or mounted on a board, a defect can be repaired and the yield is accordingly improved.

Information stored in the second storage is information regarding an operation timing of the first storage. Consequently, even after the chip is sealed in a package, the operation timing of the circuit can be adjusted. Thus, the yield is further improved and the performances of the circuit can be improved.

Further, when the memory cell of the second configuration is a nonvolatile memory cell, a booster circuit for increasing a normal source voltage to thereby generate a high voltage to be used at the time of writing data to the nonvolatile memory is provided. It becomes unnecessary to newly provide an external terminal for applying a high voltage necessary for writing.

At the time of writing or erasing data to/from the nonvolatile memory, the time necessary for the writing or erasing operation is determined by the number of repetitions of a command which does not generate a new operation. Consequently, data can be written to the nonvolatile memory with reliability without newly providing a timer or the like.

Further, in the case where a mode register for setting an operation mode designated by a signal supplied from the outside is provided, a command determined by signals supplied to the control terminals in the first combination or the second combination is a command for instructing setting of a mode to the mode register. Thus, the first and second storages can be operated separately by using an existing command without newly providing an external control terminal.

Further, in a system in which a first semiconductor device and a second semiconductor device which can access a storage included in the first semiconductor device are mounted on a single printed wiring board, the storage includes a volatile memory and a nonvolatile memory, the first semiconductor device further comprises: a plurality of first input terminals for receiving a plurality of control signals; and a plurality of second input terminals for receiving a plurality of address signals, each of a first command for controlling the volatile memory and a second command for controlling the nonvolatile memory is specified by signals supplied to the plurality of first input terminals and signal (s) supplied to one or more of the plurality of second input terminals, and a combination of the plurality of control signals is common to the first command and the second command, and the signal(s) supplied to one or more of the plurality of second input terminals for the first command and that (those) for the second command are different from each other.

With this configuration, also after the semiconductor integrated circuit is mounted on a board, such as a printed wiring board or a module, the defect address information or the timing adjustment information of the first storage can be written to the second storage. Thus, the reliability and performance of the system can be increased.

DETAILED DESCRIPTION OF THE INVENTION

Preferred embodiments of the invention will be described hereinbelow with reference to the drawings.

Figure 1:
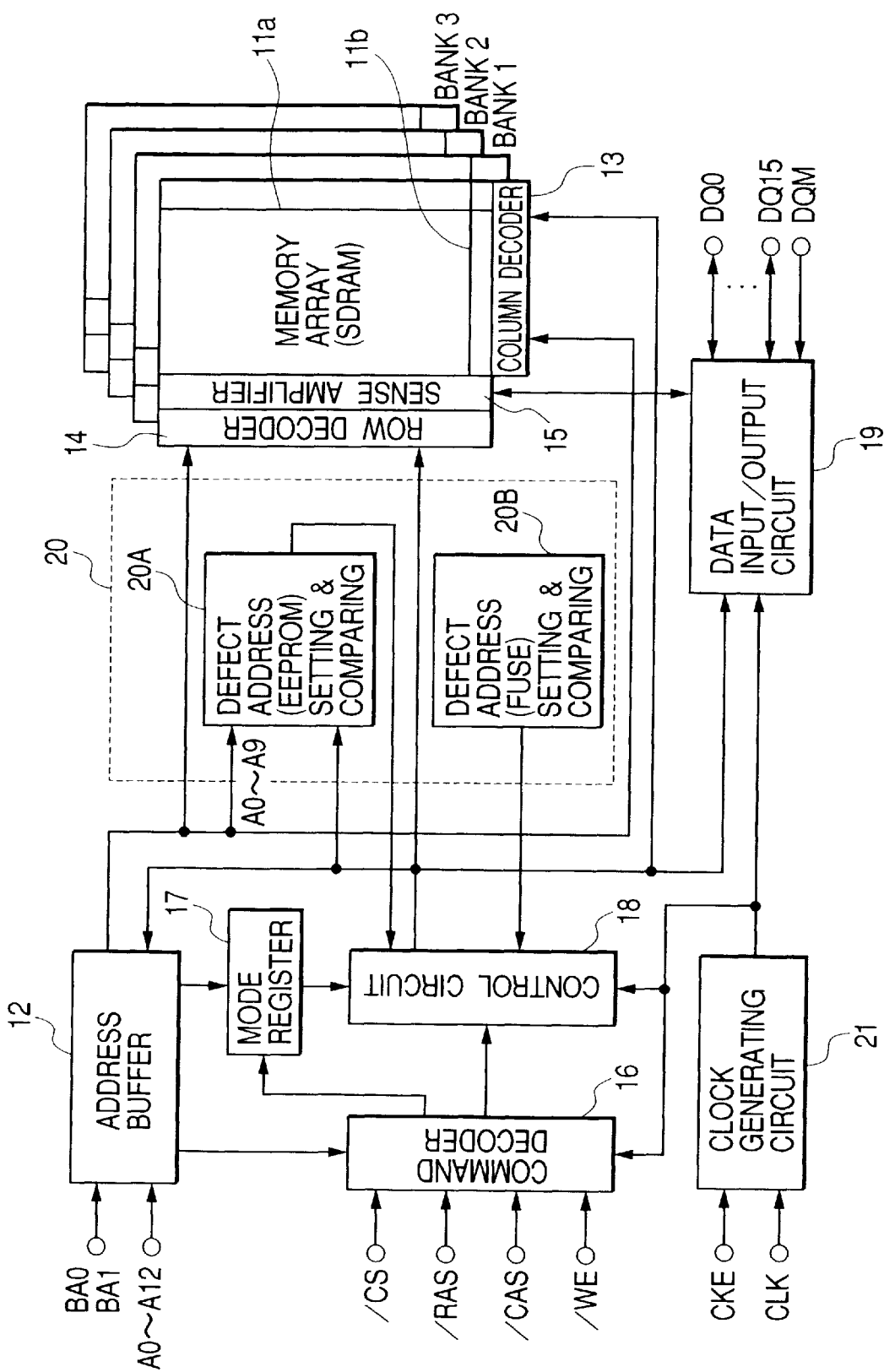
FIG. 1 is a block diagram showing a schematic configuration of an embodiment in the case where the invention is applied to an SDRAM (Synchronous Dynamic Random Access memory).

FIG. 1 shows a schematic configuration of an embodiment in the case where the invention is applied to an SDRAM (Synchronous Dynamic Random Access Memory) operating synchronously with clocks. All the circuit blocks shown in FIG. 1 are formed on a single semiconductor chip made of single crystal silicon or the like. Circle signs indicate pads used as external terminals provided for the semiconductor chip. Other than the external terminals shown in the drawing, a source voltage terminal is provided to which a source voltage is supplied from the outside.

The SDRAM of FIG. 1 has a memory cell array 11 constructed by, for example, four banks, in each of which a plurality of memory cells are arranged in the form of a matrix; an address buffer 12 for capturing address data (hereinbelow, simply called an address) entered from the outside in a multiplex manner; a row address decoder 14 for decoding a row address captured by the address buffer 12 and for selecting a corresponding word line in the memory array 11; a column address decoder 13 for decoding a column address captured by the address buffer 12 and for selecting a corresponding column (bit line) in the memory array 11; a sense amplifier circuit 15 for amplifying the potential of the selected bit line; a command decoder 16 for receiving a control signal, such as a chip select signal/CS entered from the outside and for interpreting the command; a mode register 17 in which an operation mode is set according to the input command; a control circuit 18 for generating an internal control signal in accordance with the input command and the state of the mode register 17; a data input/output circuit 19 for outputting data read from the memory cell array 11 to the outside, for receiving data input from the outside and for transferring the data to the sense amplifier circuit; an address comparing circuit 20 for storing the address of a defect by using a nonvolatile memory device, such as an EEPROM or a fuse, for comparing the defect address with an address input from the outside, and, when the addresses coincide with each other, for selecting a spare memory row 11a or a spare memory column 11b in the memory array 11; and a clock generating circuit 21 for generating a clock signal for operating an internal circuit on the basis of a clock signal CLK having a constant frequency supplied from the outside and a clock enable signal CKE indicating that the clock is valid. It is constructed so that not one defect address but a plurality of defect addresses (for example, four) can be set according to the number of spare memory rows 11a or spare memory columns 11b for each memory bank.

Control signals supplied from the outside to the command decoder 16 include, except for the chip select signal/CS for making the chip enter a selected state, a row address strobe signal/RAS (hereinbelow, called an RAS signal), a column address strobe signal/CAS (hereinbelow, called a CAS signal), and a write enable signal /WE for instructing a data writing operation. With respect to signals with "/" in front of their reference characters, the low level denotes a valid level. The command decoder 16 decodes the control signals /CS, /RAS, /CAS, and /WE and a part of the address signals to interpret an input command. Such a command system is typical in the SDRAM. Further, commands in the SDRAM in the embodiment include a READ command for instructing a reading operation, a WRITE command for instructing a writing operation, and an MRS command for instructing the setting of an operation mode to the mode register 17. The kinds of commands and controls in the memory will be described in detail hereinlater.

In the SDRAM constructed so that CAS latency (the number of clock cycles in a period from entry of a column address to output of read data) and the like can be set, a register for holding a value CL of the CAS latency set according to entry of the MRS command is provided in the command decoder 16 or the mode register 17. Addresses supplied from the outside include bank addresses BA0 and BA1 for designating a bank in the memory array 11 and addresses A0 to A12 for designating a memory cell in a bank. The data input/output circuit 19 is constructed to determine whether data DQ0 to DQ15 of, for example, 16 bits is masked (made valid) or not on the basis of a control signal DQM supplied from the outside.

Although the invention is not particularly limited, in the embodiment, the address comparing circuit 20 has therein an EEPROM cell for setting defect address information, a first defect address setting and comparing circuit 20A for comparing the set address with an input address and for determining whether the addresses coincide with each other or not, and a second defect address setting and comparing circuit 20B including a fuse for setting the defect address information. The address of a defect detected before the chip is sealed in the package can be set in the defect address setting and comparing circuit 20B including the fuse, and the address of a defect detected after the chip is sealed in the package can be set in the defect address setting and comparing circuit 20A including the EEPROM. The control circuit 18 is provided with a circuit for generating a switch control signal for selecting the spare memory row 11a or the spare memory column 11b and for supplying the switch control signal to the address decoder 13 or 14 when the coincidence of the addresses is detected by the comparison.

The setting of the address of a defect by a fuse is performed by blowing the fuse using a laser or the like. The defect address is set in the defect address setting and comparing circuit 20A by supplying data, that has been captured by the address buffer 12 in an EEPROM writing mode as write data to an EEPROM cell, to the defect address setting and comparing circuit 20A. By this configuration, a detective bit can be repaired even after the chip is sealed in the package, and an increase in circuit scale can be suppressed even more as compared with the case of using only the defect address setting circuit including the EEPROM cell. Although the invention is not particularly limited, it is also possible to provide an arrangement in which storage data read from the EEPROM cell in the defect address setting and comparing circuit 20A can be outputted to the outside of the chip by the data input/output circuit 19. With such a configuration, the internal EEPROM cell can be used as means for storing information (ID) of the chip itself and the like.

Further, in the embodiment, by using the command system provided for the SDRAM, data is written/read to/from the EEPROM included in the defect address setting and comparing circuit 20A. Specifically, it is a first feature that transition to the writing or erasing mode of the EEPROM cell is made by using the MRS command (mode register setting command) of the SDRAM. It is a second feature that a new command is defined by changing a part of the MRS command determined by a combination of the control signals /CS, /RAS, /CAS, and /WE and a part of the address signals, the command decoder 16 decodes the command, the state transition is made to an idle state for starting an access to the EEPROM, and, after that, writing or erasing is executed by using a command common to the SDRAM.

Figure 2:
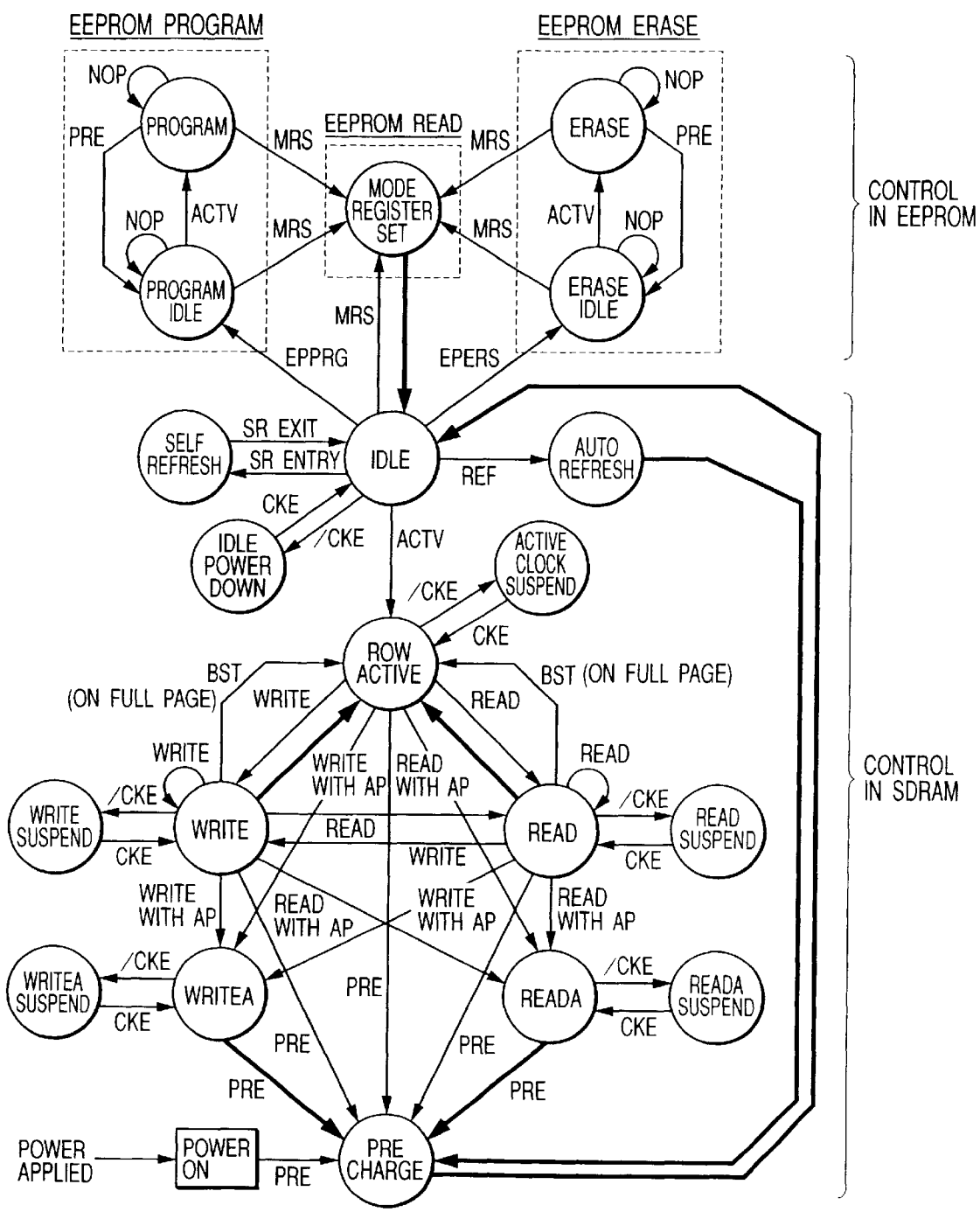
FIG. 2 is a state transition diagram showing a state of change in a control state by various commands and the like in the SDRAM of the embodiment.

FIG. 2 shows a state of change in a control state, that is, state transition by various commands and the like in the SDRAM in the embodiment. Referring to FIG. 2, the contents of the various commands and the operations of the SDRAM will be described. In FIG. 2, the circles represent the states, and a shift from one state to another state can be realized only in the direction of an arrow. In FIG. 2, the arrow having a thin line indicates transition which occurs when a command applied to the thin line is input. The arrow having a thick line indicates that transition automatically occurs without entry of a command.

Specifically, as shown in the left lower part of FIG. 2, when the power source is turned on, the state of "POWER ON" shifts to a precharge state "PRECHARGE" for charging the potential of a predetermined node (including a bit line) in a chip. After completion of the precharging, the state automatically shifts to an idle state "IDLE". When a refresh command REF is input in the idle state, the state shifts to a refresh state "AUTO REFRESH" for automatically refreshing the whole SDRAM by using an internal address counter (not shown). After completion of the refresh, the state automatically shifts to the precharging state and then to the idle state "IDLE" again.

The idle state includes an idle state in various operation modes set by the mode register 17. The idle state set for the first time after turn-on of the power is an idle state in a normal operation mode. When the mode register setting command MRS is input in the idle state"IDLE", the state shifts to a mode setting state "MODE REGISTER SET" for setting an operation mode such as a writing mode, erasing mode, or test mode of the EEPROM in accordance with the state of an address input terminal at that time in the mode register 17. After setting the mode, the state is automatically reset to the idle state.

In the lower half of FIG. 2, the state transitions in the operation mode of the SDRAM are shown, while in the upper half thereof, the state transitions in the operation mode of the EEPROM are shown. The reading/writing operation of the SDRAM is started by entry of an active command ACTV for instructing the operation start in a state where the mode register 17 is set in the normal operation mode. First, the state shifts to a row active state "ROW ACTIVE" for capturing a row address. After that, when a read command READ or a write command WRITE is input, the state shifts to a read state "READ" or a write state "WRITE". When the clock enable signal CKE goes low in the active state "ROW ACTIVE", the state shifts to a suspension state "ACTIVE CLOCK SUSPEND" for making the next input clock invalid and continuing the active state. When the clock enable signal CKE goes high, the SDRAM is reset to the original state.

When a burst stop command BST is input during the read state "READ" or write state "WRITE" in a state where the burst length set by the MRS command is a full page, a burst control for continuously interrupting the reading or writing operation is performed, while updating the column address by using the internal address counter. When the clock enable signal CKE goes low during the read state "READ" or write state "WRITE", the state shifts to a suspension state "READ SUSPEND" or "WRITE SUSPEND" for making the next input clock invalid to interrupt the reading or writing state. When the clock enable signal CKE is changed to the high level, the SDRAM is reset to the original state. When a read command READA with auto-precharging or a write command WRITEA with an auto-precharging is input, the state is repeated only by the number of times designated by the burst length. After that, a precharge command is automatically executed on the inside and the state is reset to the idle state "IDLE". Discrimination between a command READ WITH AP and the command READ, and discrimination between a command WRITE WITH AP and the command WRITE is performed by setting "1" to the address A10.

When the clock enable signal CKE changes to the low level in the idle state "IDLE", the state shifts to a low power operation state "IDLE POWER DOWN". When a self refresh start command SR ENTRY is input in the idle state "IDLE", the state shifts to a self refresh executing state. When the clock enable signal/CKE changes to the low level from any of the states or a self refresh end command SR EXIT is input, the state is reset to the idle state "IDLE".

Table 1 shows an example of control commands used in the operation of the SDRAM. Table 1 lists commands each issued by a predetermined combination of the low and high levels "L" and "H" of the control signals CS, RAS, CAS, and WE. "Address" indicates addresses at the address input terminal. "BA" denotes a bank address, "CA" denotes a column address, "RA" denotes a row address, "A10" indicates an address bit A10, and "X" expresses that no address is related. The control commands shown in Table 1 are commands identified in the state transition diagram of FIG. 2, and there are other commands. Commands not shown in Table 1 include, for example, a command indicating that the chip is in a not-selected state by setting the control signal CS to the high level "H".

TABLE 1

| CS | RAS | CAS | WE | Address | Command Name | DRAM operation |
|----|-----|-----|----|---------|--------------|----------------|
| L | H | L | H | BA, CA, A10 | READ | reading |
| L | H | L | L | BA, CA, A10 | WRIT | writing |
| L | L | H | H | BA, RA | ACTV | row address activation |
| L | L | H | L | BA, A10 | PRE | precharging |
| L | L | L | H | X | REF | refresh |
| L | L | L | L | MODE | MRS | mode register setting |
| L | H | H | L | X | BST | burst stop |

Specifically, for example, when the control signal CS is "L", RAS is "H", CAS is "L", and WE is "H", it is regarded that the read command READ is being issued, whereby a selected bank of the memory array is designated by the bank address BA at that time, and a selection bit line (column) is designated by the column address CA. A10 denotes the eleventh bit from the lowest bit of an address. The bit is used to instruct to precharge whether all the memory arrays are involved or only a designated memory array or to instruct whether or not a precharging operation is to be automatically performed after the reading/writing operation.

When the control signal CS is "L", RAS is "L", CAS is "L", and ViE is "L", it is regarded that the mode register setting command "MRS" is being issued, whereby an address entered at that time is captured by the mode register, and the operation mode MODE is determined according to the whole code captured or the state of a predetermined bit.

The state transition of the EEPROM will now be described.

In the case of shifting the mode to an EEPROM access mode, it can be realized by inputting a predetermined command in the idle state "IDLE". When the mode register setting command MRS is issued to set an SDRAM operation mode provided for a normal SDRAM in the mode register, written data in the EEPROM is simultaneously read. When the setting to the mode register by the mode register setting command MRS is finished, the state is automatically reset to the idle state "IDLE".

In this embodiment, when it is regarded that an EEPROM write command EPPRG or EEPROM erase command EPERS newly prepared is issued in the idle state "IDLE", the state shifts to an EEPROM write idle state "PROGRAM IDLE" or EEPROM erase idle state "ERASE IDLE". The EEPROM write command EPPRG or EEPROM erase command EPERS is a code obtained by modifying the mode register setting command MRS, that is, a code obtained by making a bit as a part of an address referred to by the mode register setting command MRS different from that in the case of the normal mode register setting command MRS. In this way, it is unnecessary to prepare a new command code.

Further, in this embodiment, when an active command ACTV commonly used by the SDRAM is issued in the EEPROM write idle state "PROGRAM IDLE" or EEPROM erase idle state "ERASE IDLE", the state shifts to the program state "PROGRAM" or erase state "ERASE" for starting writing or erasing of data to/from the EEPROM cell. When a precharge command "PRE" commonly used by the SDRAM is input in the program state "PROGRAM" or erase state "ERASE", the writing or erasing operation on the EEPROM cell is finished, and the state is reset to the EEPROM write idle state "PROGRAM IDLE" or the EEPROM erase idle state "ERASE IDLE".

Moreover, in the EEPROM program state "PROGRAM" or the EEPROM erase state "ERASE", when a no-operation command NOP accompanying no operation is input, the preceding state is maintained only by one clock cycle. The no-operation command NOP is significant also in the EEPROM write idle state "PROGRM IDLE" or the EEPROM erase idle state"ERASE IDLE". Consequently, in the EEPROM write idle state "PROGRAM IDLE" or EEPROM erase idle state "ERASE IDLE", the preparation time for generating a control signal necessary for writing or erasure can be assured. In the EEPROM program state "PROGRAM" or the EEPROM erase state "ERASE", the time required for applying a write voltage or erase voltage to the EEPROM cell can be assured.

Further, in this embodiment, when the mode register setting command MRS is input in any of the EEPROM write idle state "PROGRAM IDLE", EEPROM erase idle state "ERASE IDLE", EEPROM program state "PROGRAM", and EEPROM erase state "ERASE", the state shifts to the mode register setting state "MODE REGISTER SET". When an operation mode of the SDRAM (SDRAM accessible mode) provided for the normal SDRAM is set, data written in the EEPROM is read and the operation mode is set in the SDRAM. When the operation mode is set in the mode register, the chip automatically shifts to the idle state "IDLE".

Table 2 shows an example of the structure of each of the control commands used for the operation of the EEPROM.

TABLE 2

| CS | RAS | CAS | WE | Address | Command Name | operation of EEPROM |
|---|---|---|---|---|---|---|
| L | L | L | L | MODE | MRS | LEEPROM reading |
| L | L | L | L | AO = 0, A7 = 1, A5 = 1, ADDRES | EPPRG | writing standby |
| L | L | L | L | AO = 1, A7 = 1, A5 = 1, ADDRES | EPERS | erasure standby |
| L | H | H | H | X | NOP | continuation of preceding state |
| L | L | H | H | BA, PROGRAM DATA | ACTV | EEPROM writing |
| L | L | H | H | BA | ACTV | EEPROM erasure |
| L | H | H | L | BA, A10 | PRE | end of writing, end of erasure |

As shown in Table 2, when all the control signals CS, RAS, CAS, and WE are at the low level "L", it is regarded that the mode register setting command MRS is being issued. When a signal supplied to the address input terminal at that time is a code indicative of a predetermined operation mode, the operation mode is set in the mode register. Consequently, the SDRAM enters the standby state in the set operation mode, and data is read from the EEPROM.

When the signals A0, A7, and A5 supplied to the address input terminals are Ivory, "1", and "1", respectively, in a state where all the control signals CS, RAS, CAS, and WE are set to the low level "L" as in the mode register setting command MRS, it is regarded that the EEPROM write command EPPRG is being issued, and the state shifts to the EEPROM write idle state "PROGRAM IDLE". On the other hand, when all of the signals A0, A7, and A5 supplied to the address input terminals are "1" in a state where all the control signals CS, RAS, CAS, and WE are set to the low level "L" as in the mode register setting command MRS, it is regarded that the EEPROM erase command EPERS is issued, and the state shifts to the EEPROM erase idle state "ERASE IDLE". In the other addresses on issuance of the command EPPRG or EPERS, "EEPROM ADDRESS" for selecting an EEPROM to/from which data is written or erased is input.

When the same command code as the active command ACTV of the SDRAM is entered in the EEPROM write idle state "PROGRM IDLE", a signal supplied to the address input terminal is regarded as write data of the EEPROM and is captured. In the EEPROM erasure idle state "ERASE IDLE", a signal supplied to the address input terminal is regarded as meaningless information (described as "don't care") and is ignored, and writing or erasure is executed.

When the control signal CS is at the "L" level and all the other signals RAS, CAS, and WE are at the high level "H", it is regarded that the no-operation command NOP is issued, and the preceding state is maintained. Further, when the same command code as that of the precharge command PRE of the SDPAM is entered in the EEPROM write state "PROGRAM" or EEPROM erase state "ERASE", the state is reset to the EEPROM write idle state "PROGRAM IDLE" or EEPROM erase idle state "ERASE IDLE".

Figure 3:
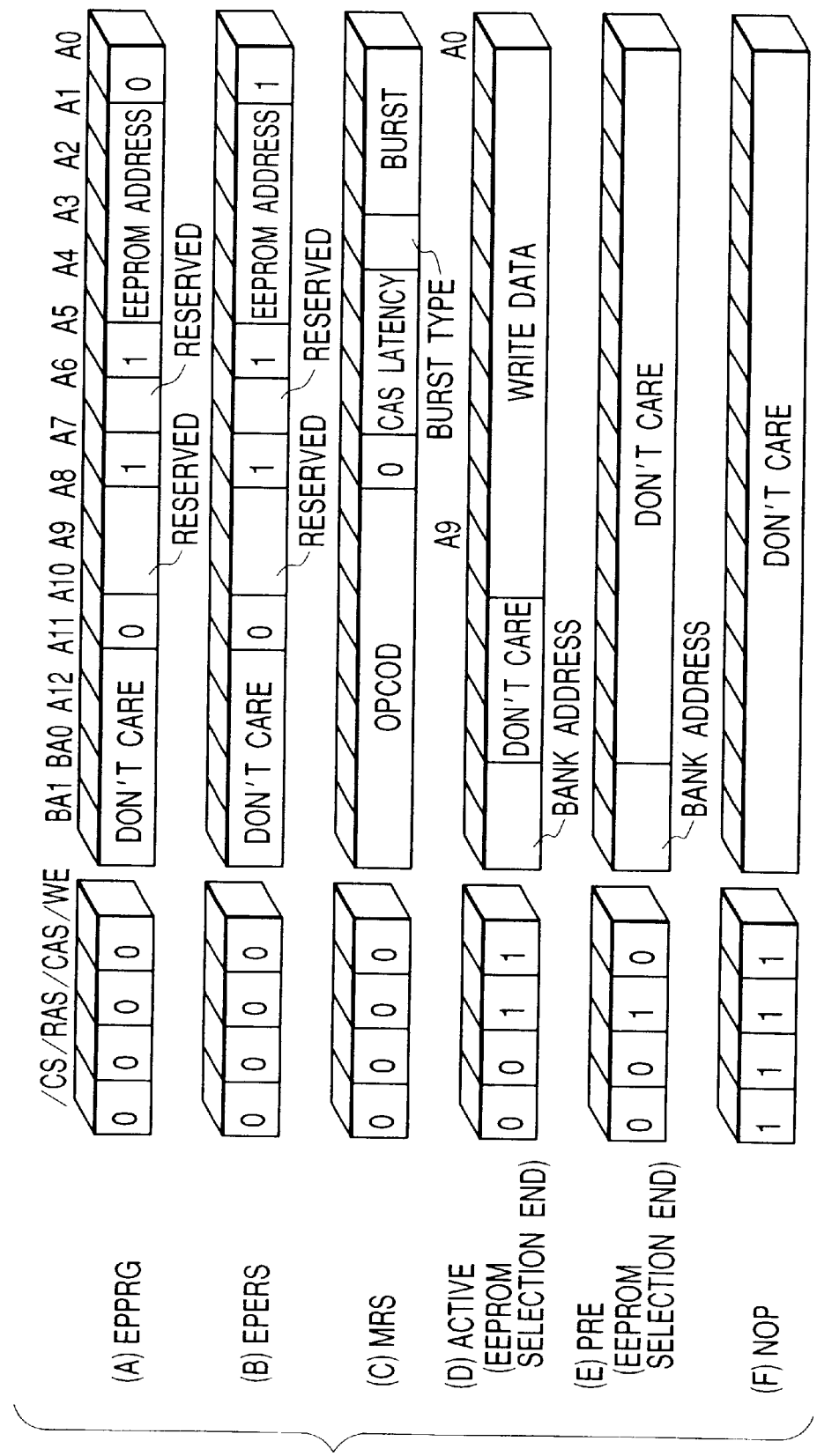
FIG. 3 is a command structure diagram showing an example of the structure of control commands used in the operation of an EEPROM.

FIG. 3 shows the relations between the control commands and address inputs used for the operation of the EEPROM, in which lines A to F show the structures of the EEPROM write command EPPRG, EEPROM erase command EPERS, mode register setting command MRS, active command ACTV, precharge command PRE, and no-operation command NOP, respectively.

In the EEPROM write command EPPRG, the EEPROM erase command EPERS, and the mode register setting command MRS, the states of the control signals CS, P,AS, CAS, and WE are common (all of them are at the low level "L"). When the address A7 is "0", it is regarded that the mode register setting command MRS is issued. When the addresses A7, A10, and A5 are "1", "0", and "1", respectively, it is regarded that the EEPROM write command EPPRG or the EEPROM erase command EPERS is issued. The EEPROM write command EPPRG and the EEPROM erase command EPERS are discriminated from each other by the address A0, and the addresses A1 to A4 are regarded as information for designating one of a set of EEPROMs (set of EEPROM cells for setting a plurality of defect addresses provided in correspondence with one memory bank). In this command, since it has information of four bits of A1 to A4, 16 sets can be selected at the maximum.

In the case of the mode register setting command MRS, the addresses A0 to A2 are used to instruct the burst length, the addresses A4 to A6 are used to instruct the CAS latency, and the addresses A8 to A12 and the bank addresses BA0 and BA1 are regarded as an operation code. The operation code is used to instruct a column command (READ, WRITE, or the like) to be operated under the condition of the designated burst length. As opposed to the other commands shown in FIG. 3, the mode register setting command MRS is not a command directly related to the operation of the EEPROM, but is a command used for shifting the state to the standby state "IDLE" (SDRAM accessible state) after setting the operation mode (CAS latency, burst length, or the like) of the SDRAM or writing or erasing operation of the EEPROM, via the EEPROM reading operation. The mode register setting command MRS can be constructed so as to shift the state to a test mode, for example, when the address A0 is "0" and the address A7 is "1".

In the active command ACTV, the bits of the addresses A0 to A9 are write data, and the bank addresses BA0 and BA1 are regarded as an EEPROM selecting address. The active command ACTV is the same for the writing and erasing, and its execution contents change according to whether the command entered in the previous state, that is, the immediately preceding command is EPPRG or EPERS. In the precharge command PRE, only the bank addresses BA0 and BA1 are valid, and BA0 and BA1 are regarded as an EEPROM selection address, that is, information for designating an EEPROM for setting a defect address corresponding to any of memory banks.

The precharge command PRE is the same with respect to writing and erasing, but its execution contents change according to whether the command entered in the previous state, that is, before the immediately preceding active command ACTV is entered, is EPPRG or EPERS. The no-operation command NOP is not connected to the addresses, but is determined only by the states of the control signals CS, RAS, CAS, and WE. According to the number of cycles in which the no-operation command NOP is continuously inserted, the writing or erasing time is determined.

Figure 4:
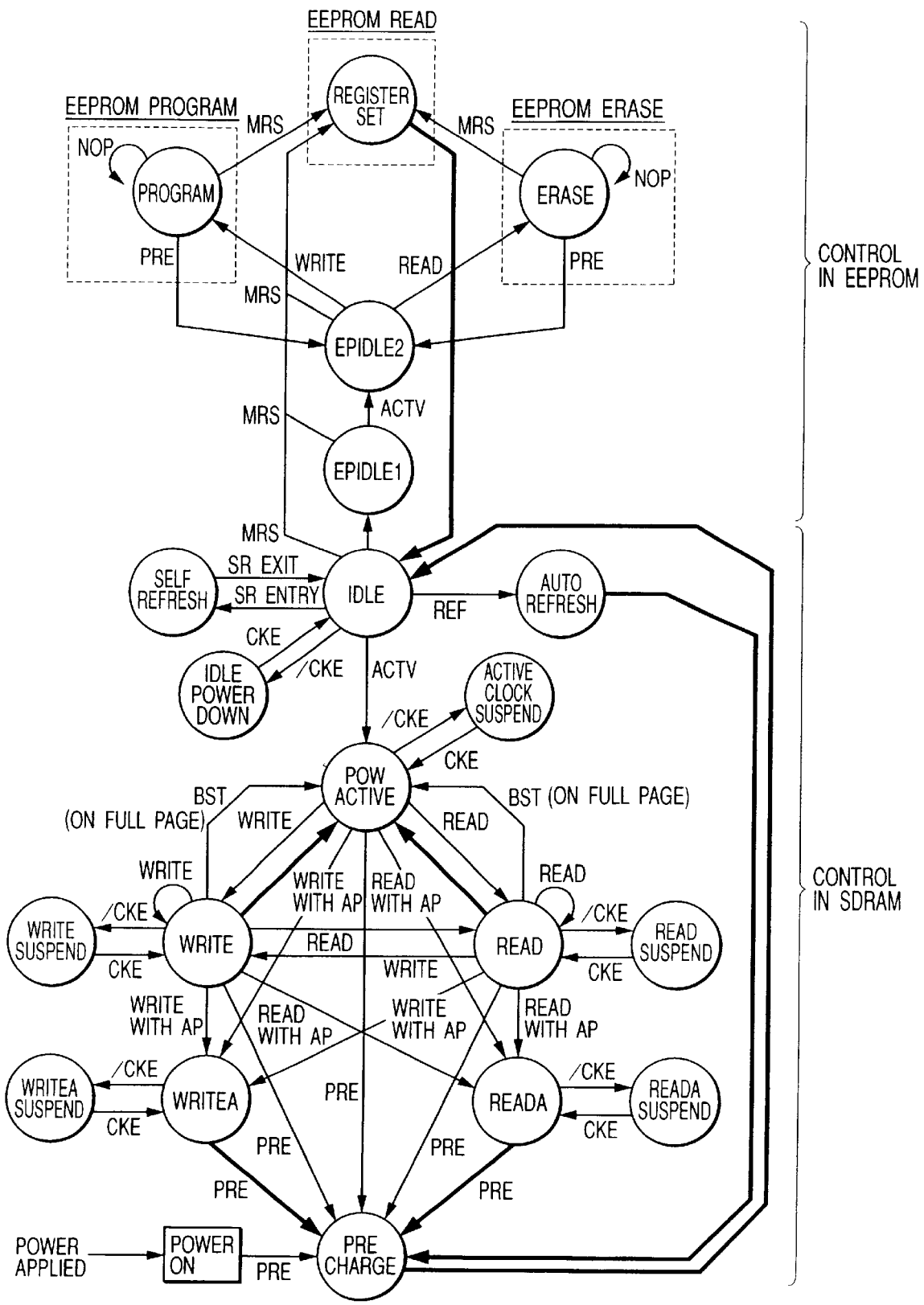
FIG. 4 is a state transition diagram showing a state of change in a control state in a chip in the case of using a second command system for accessing the EEPROM.

FIG. 4 shows a state transition in the chip when a command system different from that in the embodiment is used for accessing the EEPROM.

In this embodiment, the EEPROM write command EPPRG and the EEPROM erase command EPERS are omitted from the command system of the foregoing embodiment. Instead, a command EPMOD for instructing a shift to an EEPROM access mode is provided. When the command EPMOD is entered, the state shifts to a first EEPROM idle state "EPIDLE1". Further, when the active command ACTV is entered, the state shifts to a second EEPROM idle state "EPIDLE2". When the command WRITE is entered in such a state, the state shifts to an EEPROM write state. When the command READ is entered, the state shifts to an EEPROM erase state.

In each of the write state and the erase state, by entering the no-operation command NOP a predetermined number of times in a maimer similar to the first embodiment, the time necessary for the writing or erasing operation is assured. Further, in a manner similar to the command system of the first embodiment, when the mode register setting command MRS is entered in the EEPROM mode the state shifts to the mode register setting state "MODE REGISTER SET". When an operation mode of the SDRAM (SDRAM accessible mode) is set, data is read in the EEPROM. The state transition of the SDRAM is similar to that in the first embodiment shown in FIG. 2.

Figure 5:
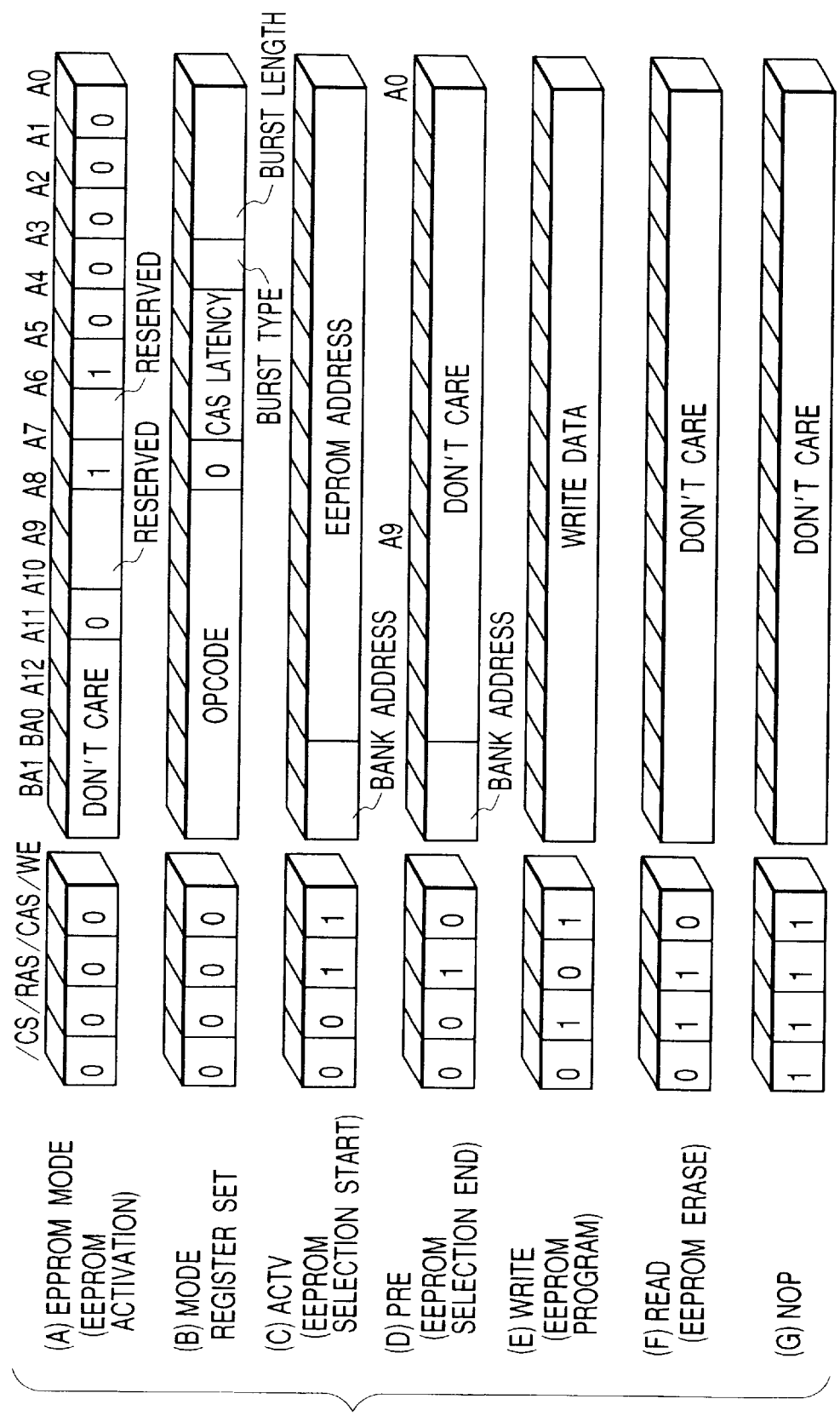
FIG. 5 is a command structure diagram showing an example of the structure of commands realizing the state transition as shown in FIG. 4.

FIG. 5 shows an example of the structures of commands which enable the state transition as shown in FIG. 4 to be made. As obviously understood by comparison with FIG. 3, the precharge command PRE and the no-operation command NOP have quite the same structures and the same meaning as that of the precharge command PRE and the no-operation command NOP in the command system of the first embodiment, respectively. An EEPROM access mode shifting command EPMOD is, in a manner similar to the EEPROM write command EPPRG and the EEPROM erase command EPERS in the command system of the first embodiment, a command major part specified by the control signals CS, RAS, CAS, and WE is common to the mode register setting command (all of the signals are at the low level "L"). When the address A7 is "1", the address A5 is "1", and the addresses A10 and A4 to A0 are "0", it is regarded as the EEPROM access mode shifting command EPMOD.

In a manner similar to the command system of the first embodiment, the mode register setting command and the command major portion specified by the control signals CS, RAS, CAS, and WE of the active command ACTV are common to the mode register setting command and the command major portion of the active command ATCV of the SDPAM (CS and RAS are at the low level "L" and CAS and WE are at the high level "H"). The addresses A0 to A12 and BA0 and BA1 are regarded as information for designating the selected address and bank of the EEPROM.

The commands WRITE and READ in the EEPROM mode are commands which are not provided in the command system of the first embodiment. The command major portion specified by the control signals CS, RAS, CAS, and WE of the command WRITE is common to that of the write command WRITE in the SDRAM, and the command major portion of the command READ is common to that of the read command READ in the SDRAM. The address portion is different from that in the command system of the first embodiment. In the write command WRITE in the EEPROM mode, the addresses A0 to A12 and BA0 and BA1 are regarded as write data. Since the bank address is preliminarily designated by the active command ATCV, it is not included in the write command WRITE. In the erase command READ in the EEPROM mode, the addresses A0 to A12 and BA0 and BA1 are regarded as meaningless information (described as "DON'T CARE").

As described above, in the second command system as well, in order to access the EEPROM, a command system common to the SDRAM is used. In a manner similar to the command system in the first embodiment, data can be written/erased to/from the EEPROM without providing a new control signal input terminal and the like.

Figure 17A:
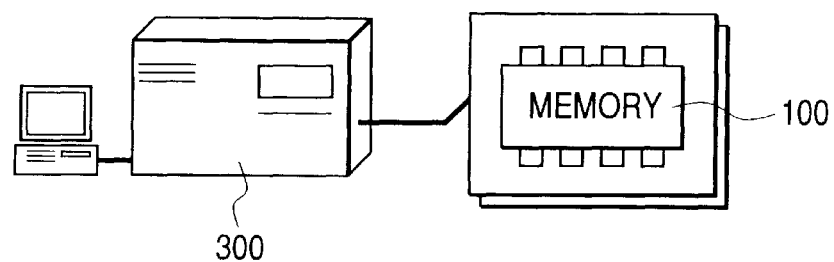
FIGS. 17A and 17B are block diagrams showing an example of a system on which a semiconductor memory to which the invention is applied is mounted.

The setting of a defect address using a fuse in a conventional RAM is generally performed in a wafer state before the chip is sealed in the package. The setting of a defect address into the EEPROM cell using the command system of the present invention can be performed not only before the chip is sealed in the package, but also, as shown in FIG. 17A, after the chip is sealed in the package by using a tester 300 or the like. By setting a defect address before and after the chip is sealed in the package, the yield can be further improved.

Figure 17B:
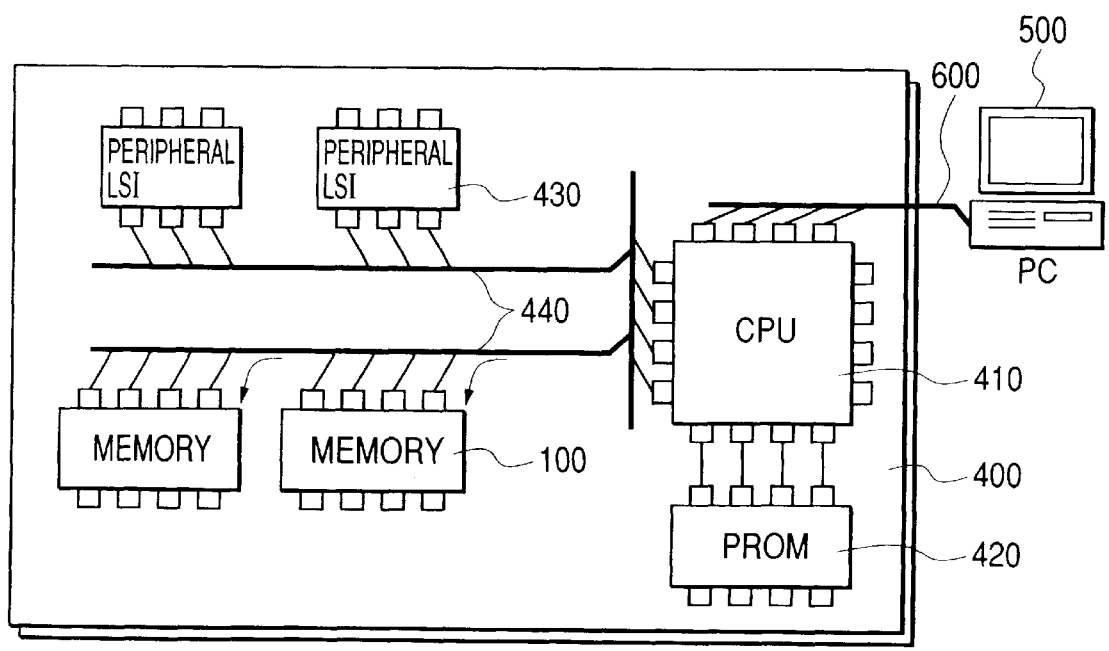

Moreover, in an SDRAM according to the present embodiment, as shown in FIG. 17B, the invention can be applied also after a system is constructed by mounting a memory 100 obtained by sealing the chip in the package on a board 400. Specifically, in a system constructed by a CPU 410, a program ROM 420 in which a program for starting the CPU and the like is stored, a peripheral LSI 430, the memory 100, and the like, a program for writing a defect address or the like to the EEPROM cell in the memory 100 is given to the board 400 from a host computer 500 or the like connected to the board 400 via a cable 600. The CPU 410 executes the program and supplies the EEPROM write command EPPRG, active command ACTV, and the like to the memory 100 via a bus 440 in accordance with a predetermined order, thereby enabling the address of a defect to be set.

Further, a system for resetting a defect address each time the power is turned on also can be constructed by storing a program for testing the memory 100 and a program to be executed, when a defect address is foundby the test, for transferring a command string to be written as a defect address into the EEPROM cell in the memory 100 in a part of the starting program stored in the program ROM 420 (a flash memory in the CPU having therein the flash memory).

An example of the configuration of the first defect address setting and comparing circuit 20A, including the EEPROM cell shown in the embodiment of FIG. 1, will now be described with reference to FIG. 6.

Figure 6:
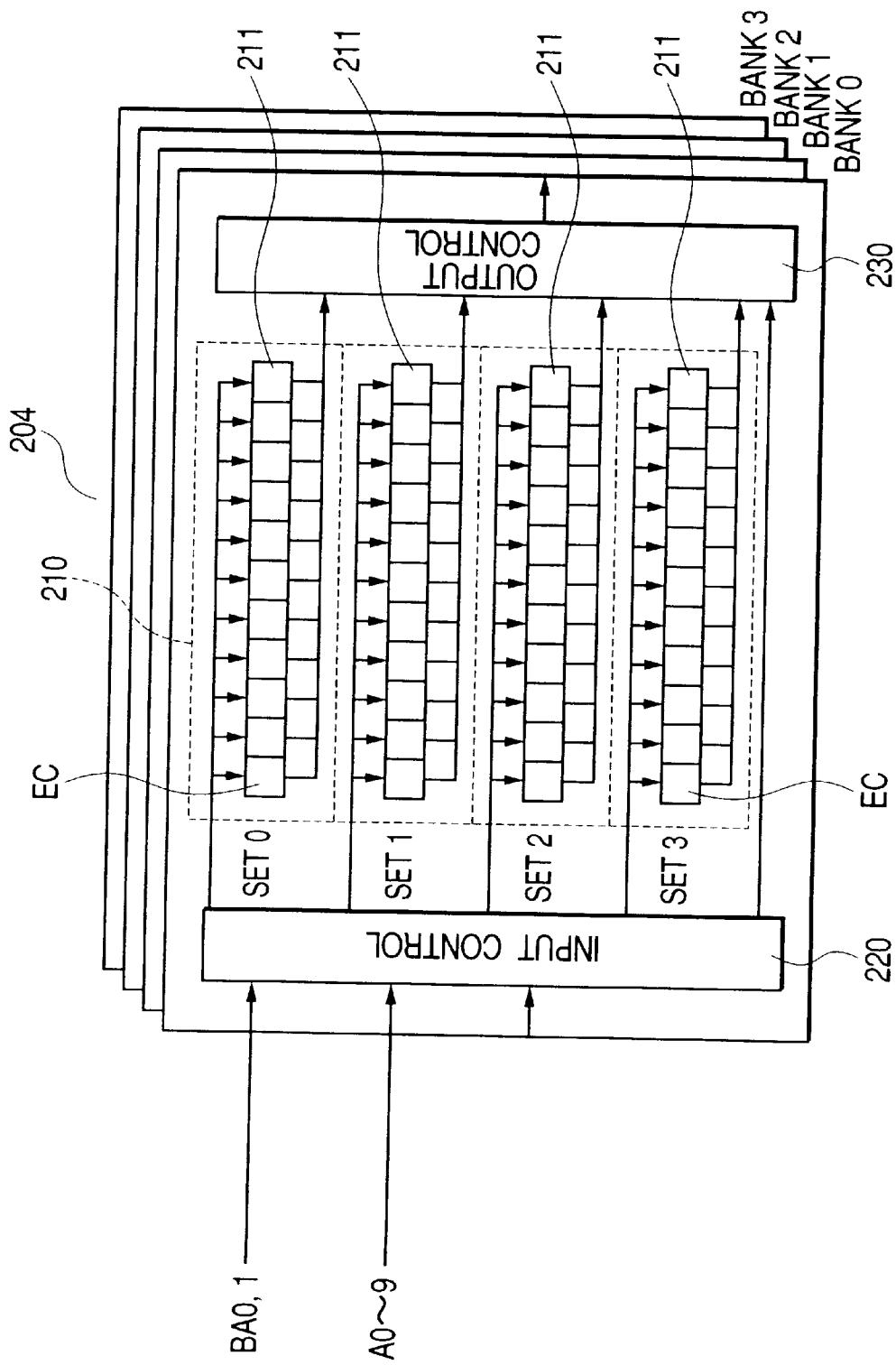
FIG. 6 is a schematic diagram showing the configuration of a defect address setting and comparing circuit.

As shown in FIG. 6, the defect address setting and comparing circuit 20A has an EEPROM array 210 capable of setting, for example, four defect addresses for four banks of the memory array 11, an input control circuit 220 for entering write data to the EEPROM array 210, and an output control circuit 230 for comparing a defect address set in the EEPROM array 210 with an input address supplied from the address buffer 12.

Although the invention is not particularly limited, in the EEPROM array 210, four EEPROM sets 211 each consisting of 11 EEPROM cells EC for storing a valid/invalid bit of an address set as a 10-bit defect address are provided per bank. In each of the EEPROM sets 211, information of 11 bits is entered in parallel and is simultaneously written, and data in all of the banks and all of the EEPROM cells can be read in a lump simultaneously.

The input control circuit 220 is provided with a selector for selecting whether write data (addresses A0 to A9) is suppflied to any of the EEPROM sets 211 or not on the basis of the input bank addresses BA0 and BA1, a circuit for generating valid-state information to be written into a valid/invalid bit in the set selected at the time of a writing operation, and a circuit for supplying the addresses A0 to A12 as they are to the output control circuit 230 so as to determine whether EEPROM write data and the input addresses A0 to A12 coincide with each other or not when the SDPAM operates on the basis of an internal control signal from the control circuit 18. It is constructed so that the data writing or erasing operation is performed on a set unit basis. The operation of erasing the EEPROM cell can be regarded as an operation for erasing written data, that is, an operation for pulling out charges injected to the EEPROM cell. It is therefore sufficient to provide the input control circuit 220 with a circuit for generating a voltage to pull out charges injected to the EEPROM cell irrespective of write data at the address A0 to A9 and data already written in the EEPROM at the time of erasure.

The output control circuit 230 is provided with an address comparing circuit for comparing each of the defect addresses set in the EEPROM array 210 with an input address to detect whether the addresses coincide with each other or not. The addresses are compared with each other simultaneously in all of the sets of the selected bank. When the coincidence of the addresses is detected in the output control circuit 230, a coincidence detection signal is supplied to the control circuit 18 in FIG. 1, and a switch signal (or replacement address) for selecting a spare memory column or a spare memory row is outputted from the control circuit 18 to the address decoder 13 or 14.

Figure 7:
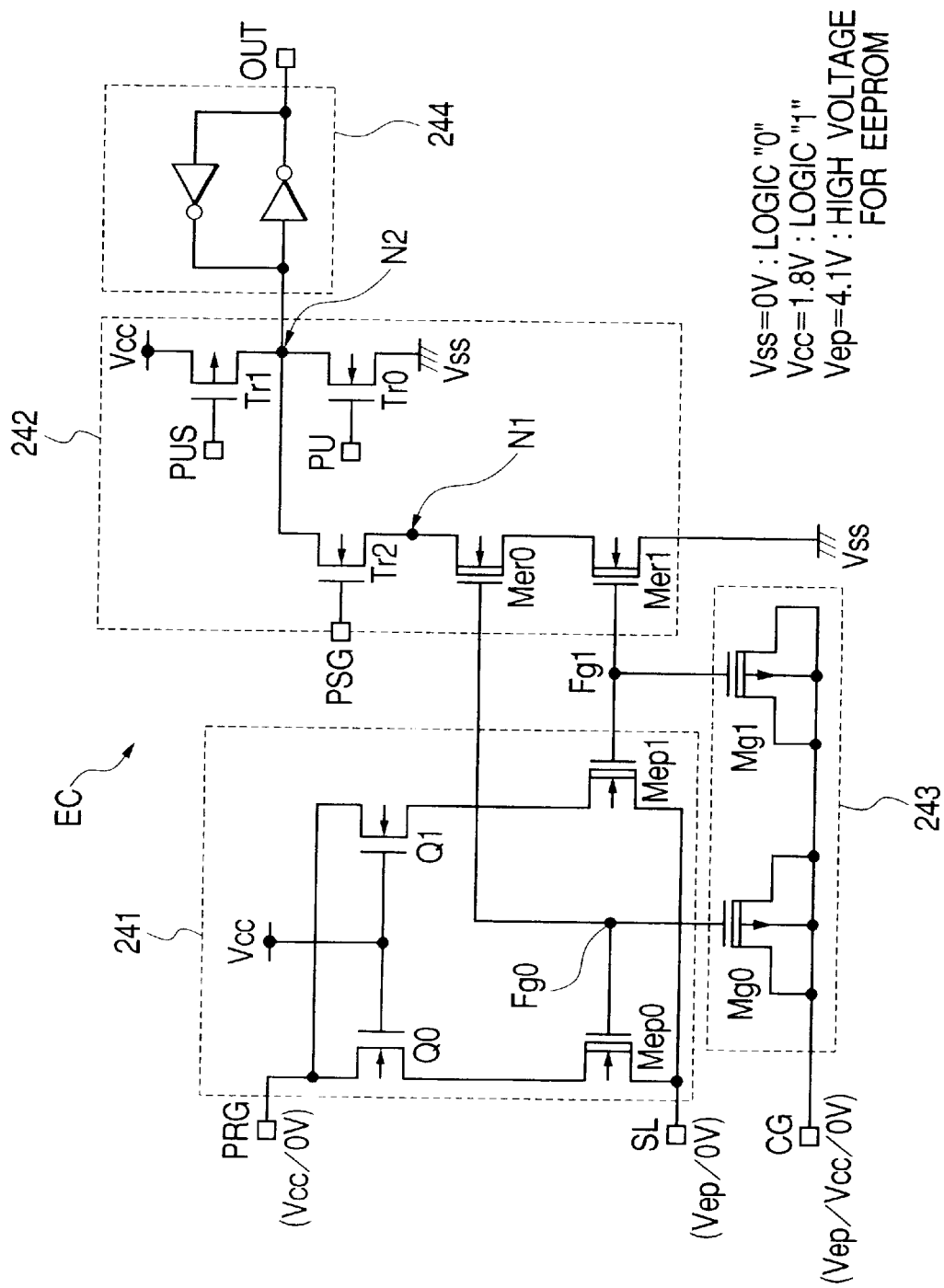
FIG. 7 is a schematic circuit diagram showing a specific example of an EEPROM cell EC as a component of the defect address setting and comparing circuit.

FIG. 7 shows an example of the circuit of the EEPROM cell EC as a component of the defect address setting & comparing circuit 20A in FIG. 6.

As shown in FIG. 7, the EEPROM cell EC is constructed by a write circuit 241, a read circuit 242, a control gate circuit 243, and a data latch circuit 244. Although the invention is not particularly limited, in this embodiment, a MOSFET of a gate double structure having a floating gate and a control gate is not used, but rather a MOSFET having the same structure as that of an ordinary MOSFET having only a control gate, in which a gate insulating film is slightly thick, is used as a memory device. The MOSFET stores data while changing a threshold value in accordance with whether or not charges are stored in the control gate of the memory device. The configuration will be described in detail hereinbeiow. In FIG. 7, a MOSEET with an arrow pointing outside is a P-channel MOSFET, and a MOSFET with an arrow pointing inside is an N-channel MOSFET.

In FIG. 7, three MOSFETs designated by Mep0, Mer0, and Mg0 construct a cell for storing data of one bit, and a cell constructed by another set of MOSFETs Mep1, Mer1, and Mg1 is provided to increase data reliability so that the same data can be written to another cell. The control gate of one of the sets of three MOSFETs constructing the cells and that of the other set are coupled to each other, and common gates Fg0 and F4g1 are floated with respect to a potential. The MOSFETs are controlled to store data while changing threshold values of Mep0, Mer0, Mep1, and Mer1 depending on whether or not charges are accumulated in the common gates Fg0 and Fg1.

Specifically, the six MOSFETs Mep0, Mer0, Mg0, Mep1, Mer1, and Mg1 constructing the cells are devices each having a high withstand voltage and having a gate oxide film thicker than that of other MOSFETs as components of the circuit. The sources, drains, and base bodies (wells) of the MOSFETs Mg0 and Mg1 are coupled to each other, and the MOSFETs Mg0 and Mg1 are connected to a control terminal CG, thereby realizing the function of the control gate in an inherent EEPROM device having a two-layer gate in the whole device.

The MOSFETs Mep0 and Mep1 constructing the cell have sources commonly connected to each other and also to a source terminal SL to which a high write erase voltage Vep is applied, and they have the drain terminals thereof connected to a write data terminal PRG to which write data is applied via normal MOSFETs Q0 and Q1, respectively. A source voltage Vcc is applied to the gates of the MOSFETs Q0 and Q1, and the MOSFETs Q0 and Q1 function as a constant current device.

On the other hand, the MOSFETs Mer0 and Mer1 constructing the cell are connected so that the channels are in series. The source terminal of the MOSFET Mer1 is connected to the ground potential GND, and the drain terminal (node N1) of the MOSFET Mer0 is connected to a precharge node N2 via a MOSFET Tr2 for reading control. A MOSFET Tr1 for precharging is connected between the precharge node N2 and the source voltage terminal Vcc. A MOSFET Tr0 for discharging is connected between the precharge node N2 and the ground potential GND. The latch circuit 244, which is constructed by a pair of inverters for determining the potential of the node and latching the logical state, is connected to the precharge node N2. Voltages applied to the various terminals SL, CG, and PRG shown in the circuit and control signals PSG, PUS, and PU are generated on the basis of input commands, write data, and the like in the input control circuit 220.

Figure 8:
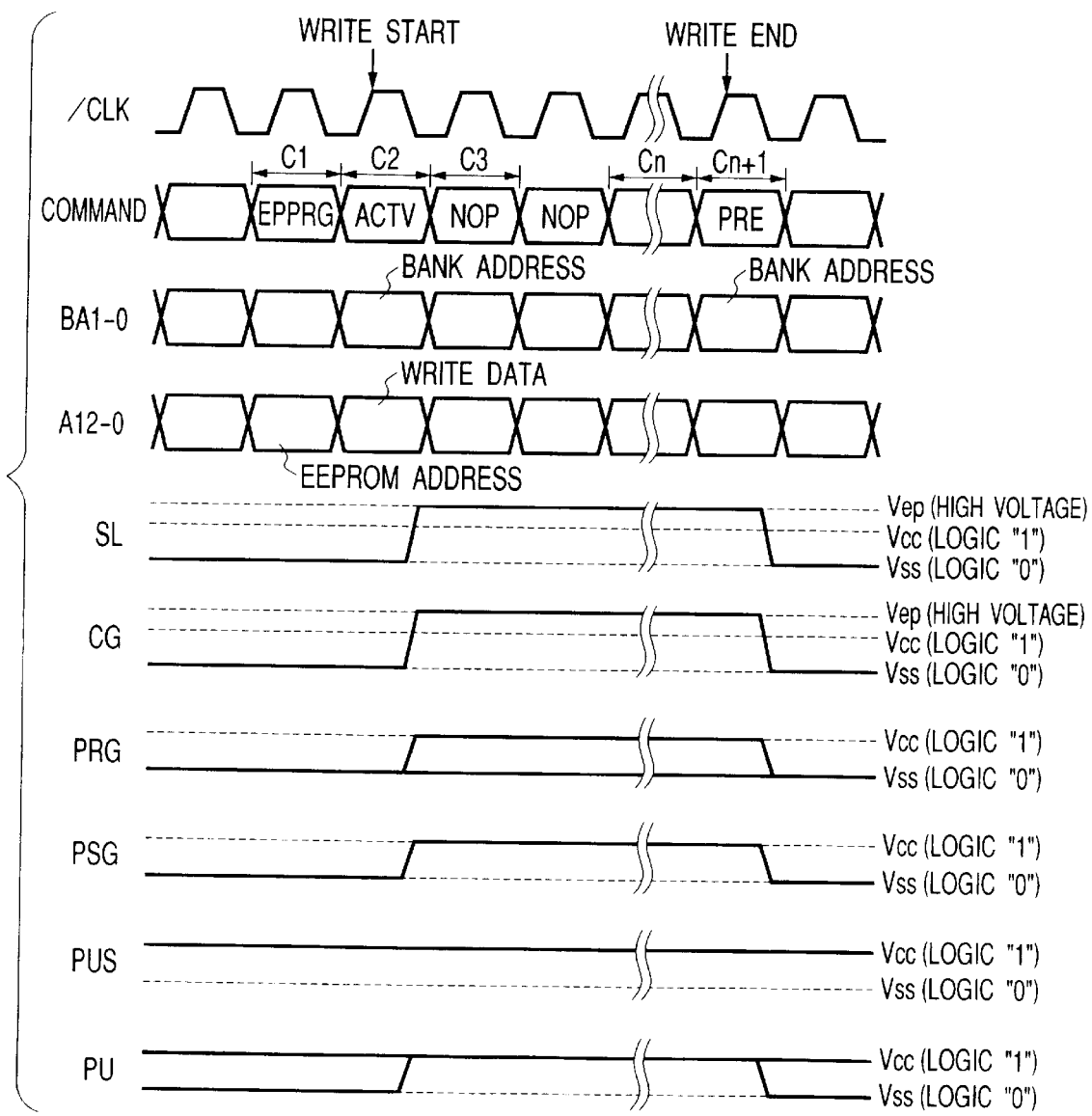
FIG. 8 is a timing chart showing the order of a writing operation of the EEPROM cell.

The operation of writing data to the EEPROM cell of FIG. 7 will be described with reference to the timing chart of FIG. 8. A command system to be used is the command system described in the first embodiment shown in FIGS. 2 and 3.

Figure 9:
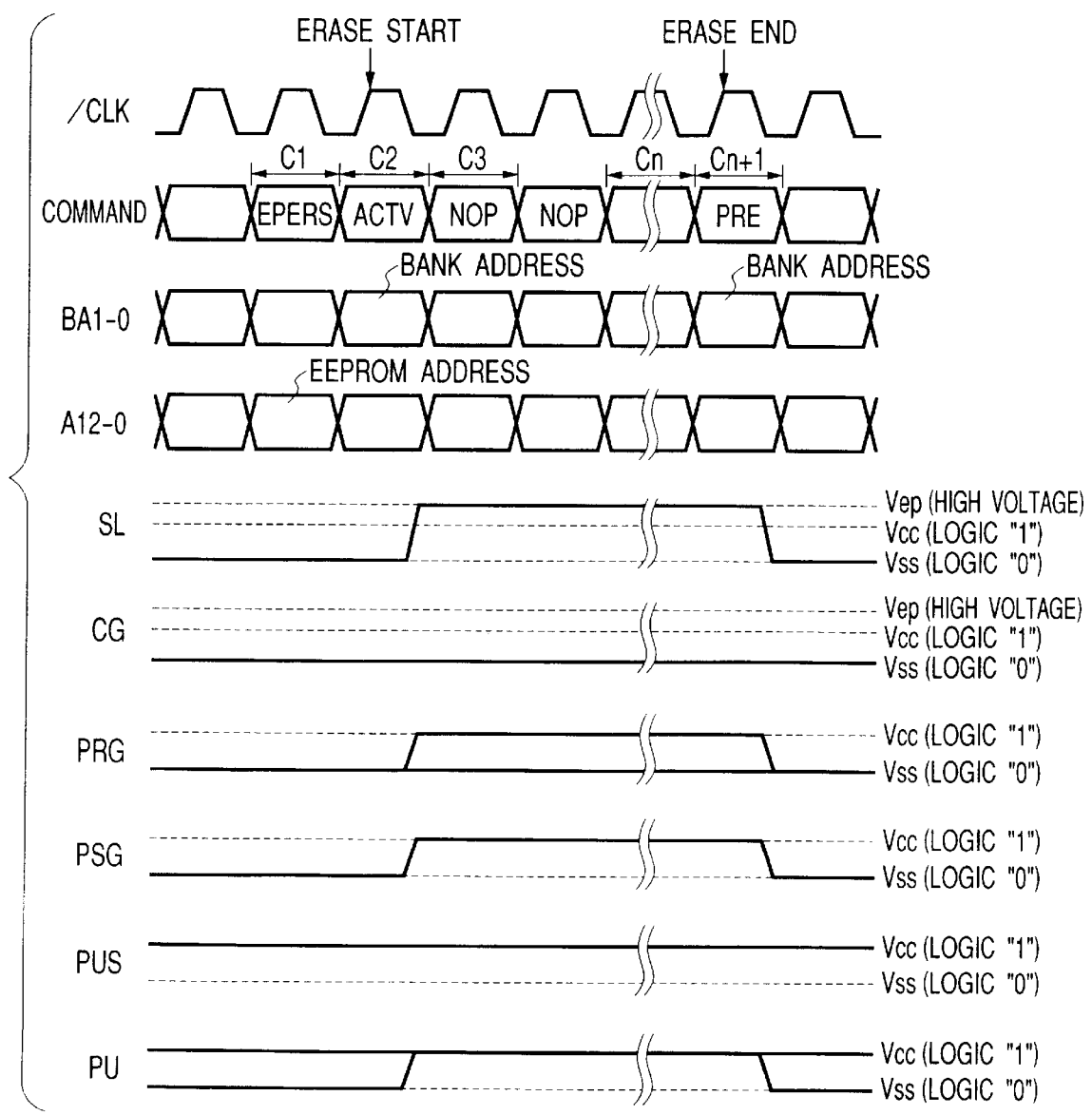
FIG. 9 is a timing chart showing the order of an erasing operation of the EEPROM cell.

At the time of writing data to the EEPROM cell, first, the write start command EPPRG accompanying an address for selecting an EEPROM set is entered (in cycle C1 in FIG. 9). By this operation, in the defect address setting and comparing circuit 20A, an EEPROM set to which data is to be written is selected. In the next cycle C2, the active command ACTV including a bank address and write data is entered. In the EEPROM cell EC, the high voltage Vep, such as 4.1V, is applied to the source terminal SL and the control terminal CG in the write circuit 241. When write data is "0", the source voltage Vcc (1.8V) is applied to the write data terminal PRG. When the write data is "1", the ground potential (0V) is applied to the write data terminal PRG. At this time, in the read circuit 242, by setting the control signals PSG, PUS, and PU to the high level, the MOSFETs Tr2 and Tr0 are turned on, the MOSFET Tr1 is turned off, the source and drain terminals of the MOSFETs Mer0 and Mer1 are fixed to the ground potential, and an inactive state is obtained. After that, when the no-operation command NOP is entered during more than a predetermined number of cycles, while the command NOP is entered (cycles C3 to Cn in FIG. 8), the bias state is maintained.

As a result, when the voltage Vcc is applied to the write data terminal PRG in response to the write data "0", no current flows across the source and drain of each of the MOSFETs Mep0 and Mep1. When 0V is applied in response to the write data "1", a current flows across the source and drain of each of the MOSFETs Mep0 and Mep1, and generated hot electrons are injected to floating gates Fg0 and Fg1 biased by the positive voltage (Vep) Consequently, the threshold values of the MOSFETs Mep0, Mep1, Mer0, and Mer1 are set to high. When the precharge command PRE is entered finally (cycle Cn+1), the source terminal SL in the write circuit 241, the control terminal CG, and the write data terminal PRG are changed to the ground potential, and the writing operation is finished.

The operation of erasing data in the EEPROM cell in FIG. 7 will now be described with reference to the timing chart of FIG. 9.

At the time of erasing data in the EEPROM cell, first, an erase start command EPERS accompanying an address for selecting an EEPROM set is entered (cycle C1 in FIG. 9). By this command, in the defect address setting and comparing circuit 20A, an EEPROM set from which data is to be erased is selected. In the next cycle C2, the active command ACTV accompanying a bank address is entered. In the EEPROM cell EC, the high voltage Vep is applied to the source terminal SL in the write circuit 241, the ground potential is applied to the control terminal CG, and the source voltage Vcc is applied to the write data terminal PRG. At this time, in the read circuit 242, by setting the control signals PSG, PUS, and PU to the high level, the MOSFETs Tr2 and Tr0 are turned on, the MOSFET Tr1 is turned off, the source and drain terminals of the MOSFETs Mer0 and Mer1 are fixed to the ground potential, and an inactive state is obtained. After that, when the no-operation command NOP is entered during more than the predetermined number of cycles, while the command NOP is entered (cycles C3 to Cn), the bias state is maintained.

As a result, the high voltage Vep is applied to the source terminal SL, the voltage Vcc is applied to the write data terminal PRG, and the ground potential is applied to the control terminal CG. Consequently, electrons accumulated in the floating gates Fg0 and Fg1 are pulled out to the source terminal SL side through the gate insulating films of the MOSFETs Mep0 and Mep1 by the tunnel phenomenon. Consequently, the threshold values of the MOSFETs Mep0, Mep1, Mer0, and Mer1 are set to be low. When the precharge command PRE is entered finally (cycle Cn+1), the source terminal SL in the write circuit 241 and the write data terminal PRG are changed to have the ground potential, and the erasing operation is finished.

Figure 10:
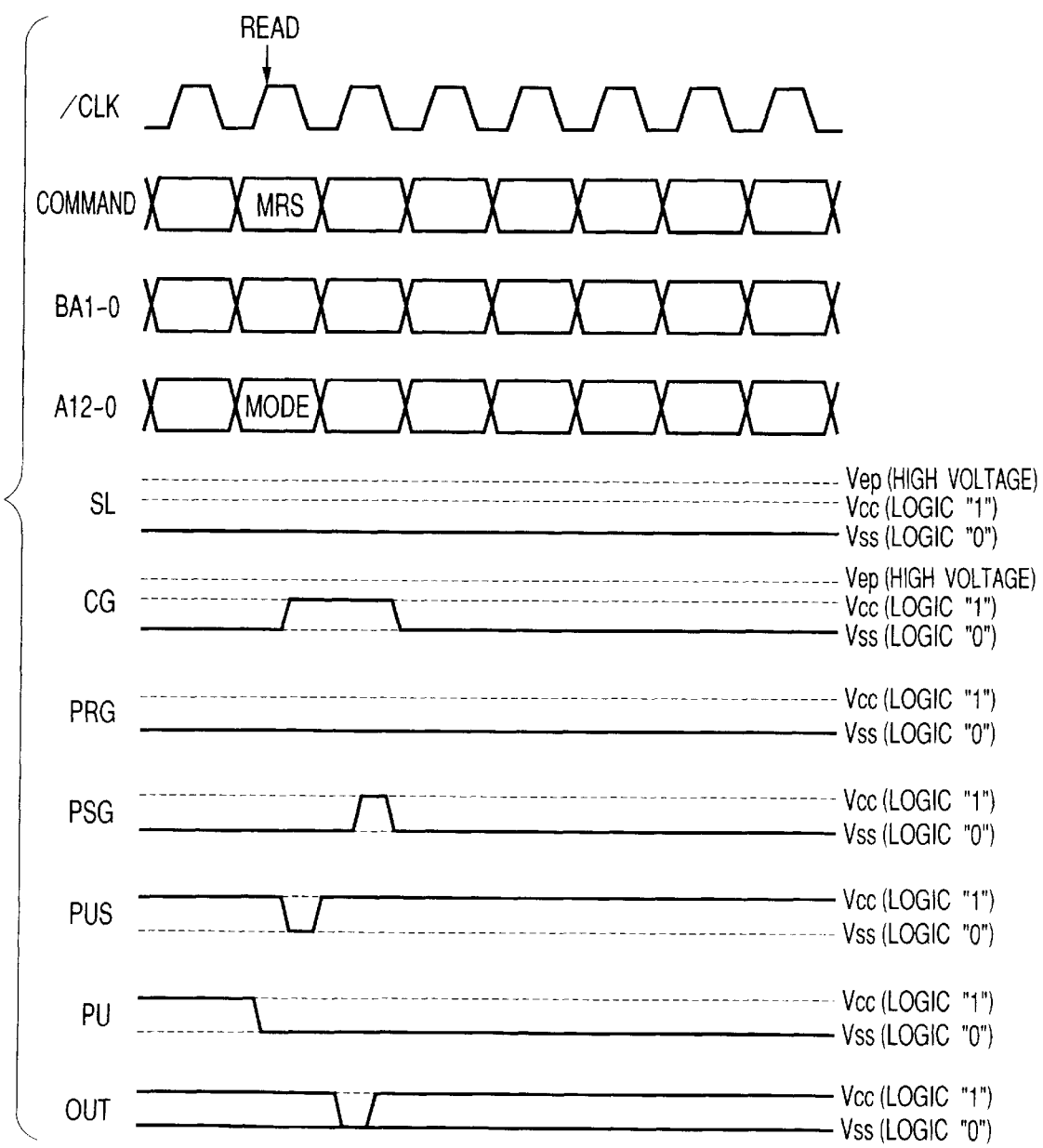
FIG. 10 is a timing chart showing the order of a reading operation of the EEPROM cell.

An operation of reading data in the EEPROM cell in FIG. 7 will now be described with reference to the timing chart of FIG. 10.

At the time of reading data in the EEPROM, the mode register setting command MRS is entered. By this command, in the defect address setting and comparing circuit 20A, in each of the EEPROM cells EC in all the EEPROM sets of all the banks, the ground potential is applied to the source terminal SL and the write data terminal PRG of the write circuit 241, and the source voltage Vcc is applied to the control terminal CG. At this time, in the read circuit 242, first, in a state where the control signal PU is changed to the low level and the MOSFET Tr0 is turned off, a negative control pulse PUS is applied, thereby turning on the MOSFET Tr1, and precharging the node N2.

Finally, by applying the positive control pulse PSG, the MOSFET Tr2 is turned on. In the case where electrons are injected to the gates of the MOSFETs Mer0 and Mer1, the thresholds are high. Consequently, no current is passed to the MOSFETs Mer0 and Mer1, and the potential at the node N2 maintains the voltage Vcc. Consequently, inversion data of the logic state is latched by the data latch circuit 244, and data "0" is read. On the other hand, in the case where no electron is injected to the gates of the MOSFETs Mer0 and Mer1, the thresholds are low. Consequently, a current is passed to the MOSFETs Mer0 and Mer1, the potential at the node N2 decreases to the ground potential, the inversion data of the logic state is latched by the data latch circuit 244, and data "1" is read.

The EEPROM cell of FIG. 7 is constructed in such a manner that data is read only once at the time of issuing the MRS command after turn-on of the power or the like, and it is latched in the data latch circuit 244; and, after that, the data is outputted from the data latch circuit 244. By this configuration, the number of operations of reading the EEPROM can be decreased, and leakage of charges from the floating gates, that is, deterioration in stored information, can be prevented.

Figure 11:
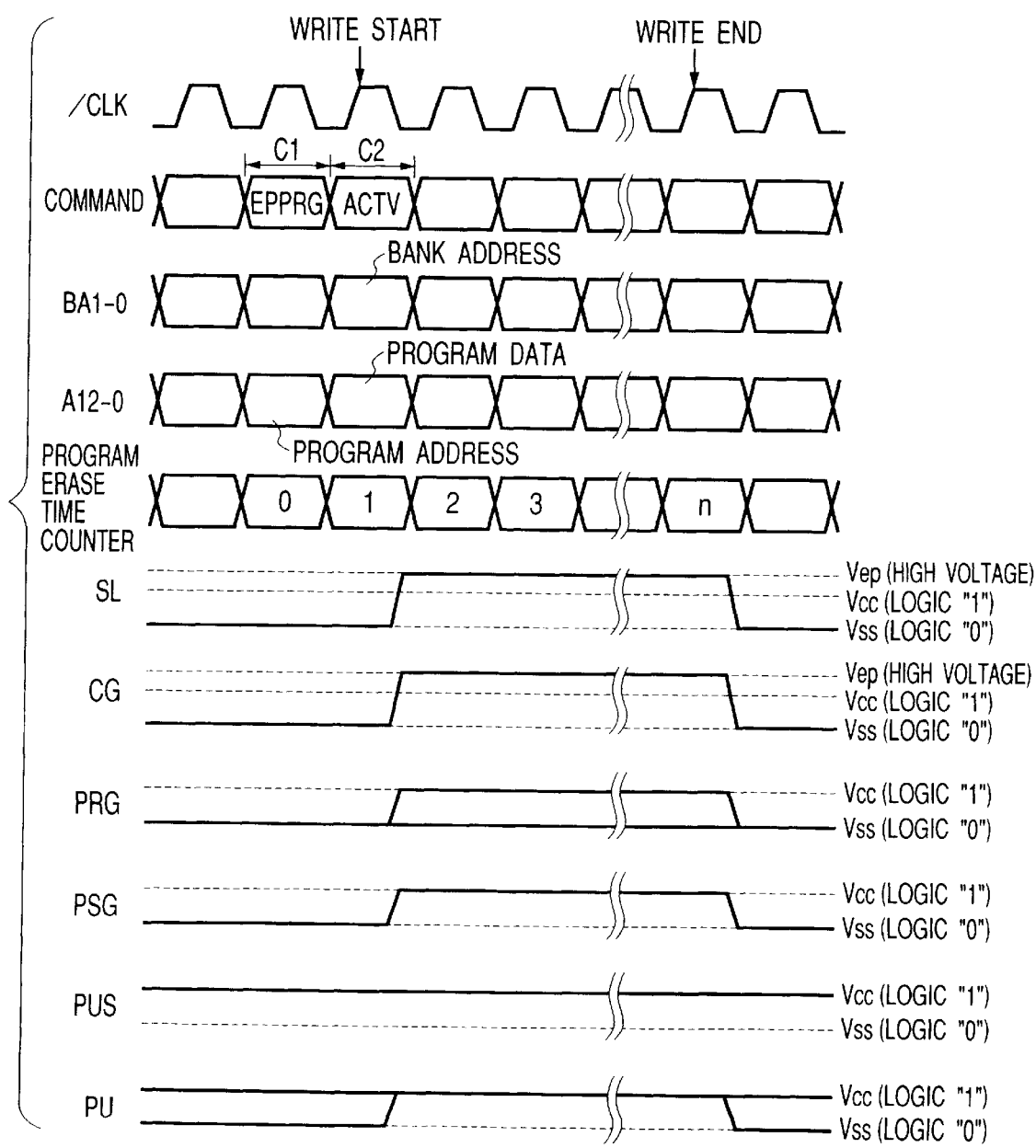
FIG. 11 is a timing chart showing an operational order in the case of controlling writing time and erasing time by using a timer counter.

Although the case of controlling the writing time and erasing time of the EEPROM by the number of cycles in which the no-operation command NOP is inserted has been described above in connection with this embodiment, it is also possible to provide a timer counter for counting the clocks CLK in the chip to thereby control the writing time and the erasing time. FIG. 11 shows timings in the case of controlling the writing time and erasing time by using such a timer counter. The timer counter is provided, for example, for the control circuit 18 in FIG. 1.

In the embodiment, first, the write start command EPPRG accompanying an address is entered (in cycle C1 in FIG. 11). By this command, in the defect address setting and comparing circuit 20A, an EEPROM set to which data is to be written is selected. In the next cycle C2, the active command ACTV accompanying a bank address and write data is entered. In the EEPROM cell EC, the high voltage is applied to the source terminal SL and the control terminal CG in the write circuit 241. When the write data is "0", the source voltage Vcc is applied to the write data terminal PRG. When the write data is "1", the ground potential (0V) is applied to the write data terminal PRG.

The timer counter counts the pulses of the clock /CLK, and the counter value increases. When the counter value reaches a predetermined value (n), an overflow signal is outputted from the timer counter, the control circuit 18 changes the source terminal SL, the control terminal CG, and the write data terminal PRG of the write circuit 241 to the ground potential, and the writing operation is finished. An erasing operation is performed almost in a similar manner. The count value of the timer counter is determined in advance at the time of system design. In this case, two timer counters, one for a writing operation and the other for an erasing operation, may be provided. It is also possible to separately prepare a command for setting a timer counter and a setting circuit (register) so that the count value of the timer counter can be adjusted by the command. Further, in place of adjusting (setting) the count value of the timer counter by the command, the count value can be also adjusted by separately providing a setting circuit including a fuse.

Further, as a method of guaranteeing the writing time and thb erasing time of the EEPROM without using the timer counter and the no-operation command NOP, for example, a method of using .a refresh command from the CPU or a memory controller for controlling refreshing of the SDRAM may be employed. In this case, the CPU or the memory controller has a refresh timer. When the command of writing data to the EEPROM is entered, the refresh timer on the CPU side is started. The CPU side is constructed as follows. Time required for the writing or erasing operation is preset as a set value of the timer. When the refresh timer times up, the refresh command is entered.

On the other hand, the input control circuit 220 for controlling the EEPROM is constructed so that when the refresh command REF is entered after the write start command EPPRG and the active command ACTV are entered, the writing operation is finished. The erasing operation is similarly performed. A method of setting the time required for the writing or erasing operation is effective in the case where data is written or erased to/from the EEPROM after the chip is sealed in the package and mounted on the board. In this case, desirably, the command decoder 16 or the input control circuit 220 is constructed so that after the writing or erasing operation is started by the active command ACTV or the like, the operation is not interrupted until the refresh command REF is entered even if other commands are received.

Figure 12:
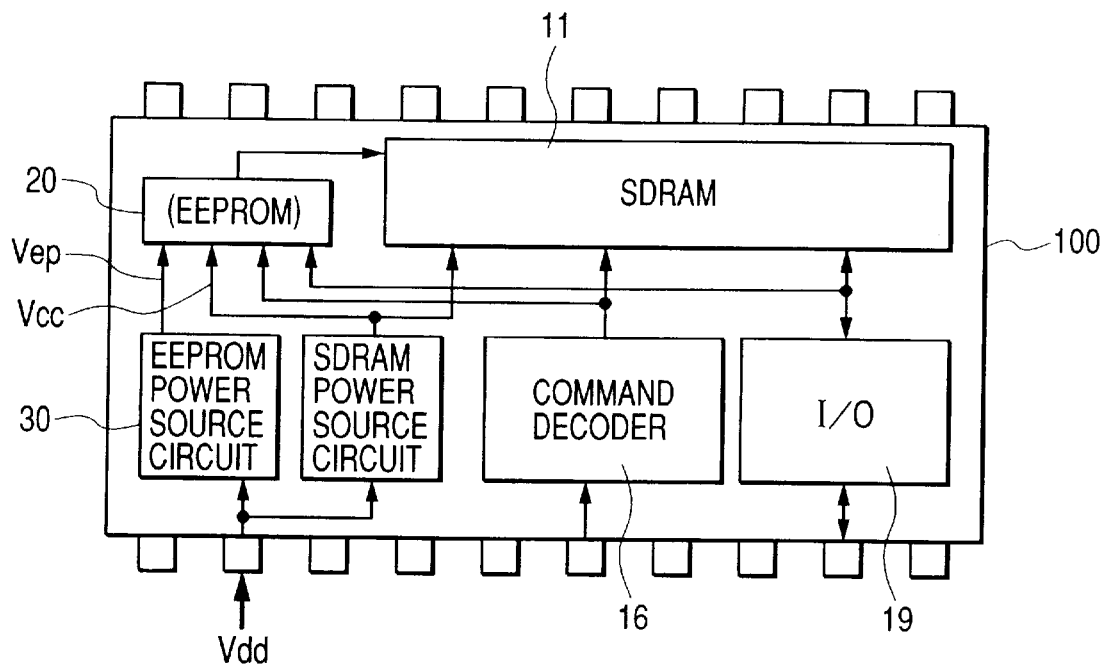
FIG. 12 is a block diagram showing an example of a specific way of supplying a high voltage to the EEPROM cell.
Figure 13:
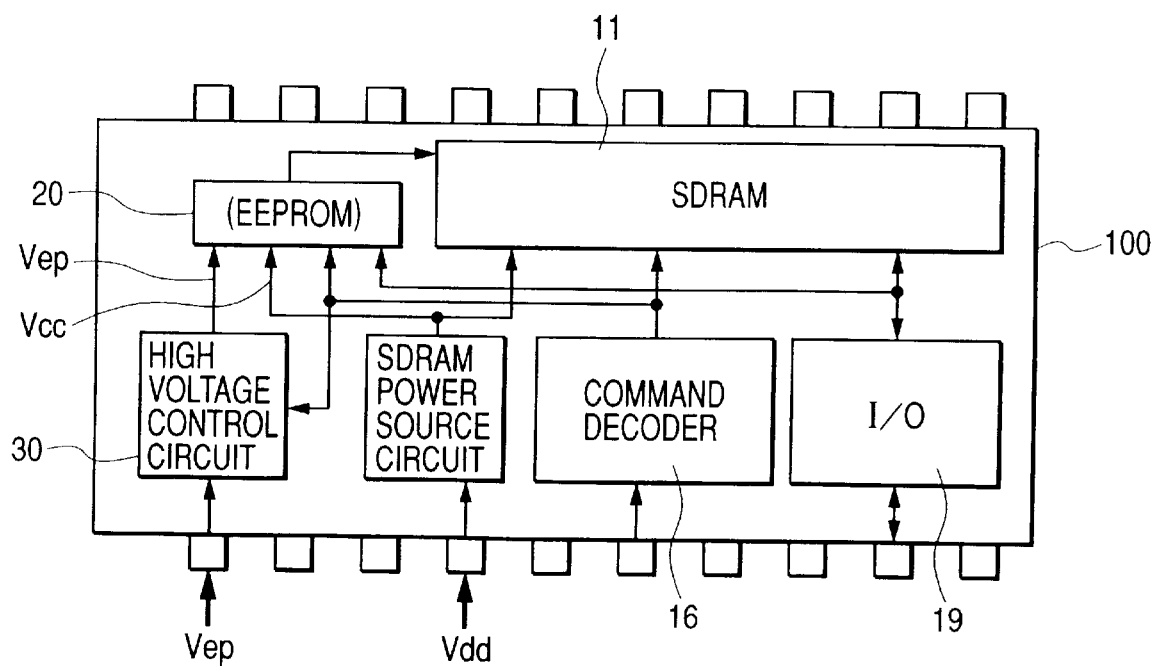
FIG. 13 is a block diagram showing another example of a specific way of supplying a high voltage to the EEPROM cell.

FIGS. 12 and 13 show specific manners of supplying a high voltage to the EEPROM cell. FIG. 12 shows an embodiment in which a circuit 30 for generating a source voltage Vep for an EEPROM constructed by a booster circuit such as a charge pump for receiving an external source voltage Vdd and increasing the %voltage is provided in the chip. According to the embodiment, it is unnecessary to provide a source terminal dedicated to the EEPROM. There is an advantage in that the number of external terminals can be reduced.

FIG. 13 shows an embodiment in which, when the chip has an unused external terminal, that is, an NC pin 40, the source voltage Vep for the EEPROM is supplied from the outside by using the NC pin 40. In this case, by providing a circuit 50 for controlling the timing for applying a high voltage to the EEPROM in the chip, the high voltage can be continuously applied from the 67 utside of the chip. According to this embodiment, it is unnecessary to provide a booster circuit on the inside, so that an increase in the chip size can be suppressed. Since an originally existing external terminal is used, there is an advantage in that a new terminal does not have to be provided.

Further, in a semiconductor memory such as the SDPAM in the foregoing embodiment, a burn-in test is conducted for applying a high voltage to a normal source terminal to operate the circuit before the chip is mounted on the board. Consequently, it is also possible to erase written data in the EEPROM cell by applying the same voltage as the high voltage for the burn-in test and using the test mode. In such a manner, the semiconductor memory which does not use the high voltage for a burn-in test while the SDRAM operates has an advantage in that the written data in the EEPROM cell can be erased without providing an internal booster circuit or a new external terminal.

The embodiment in which a defect address of the SDRAM is set by using the EEPROM cell has been described above. Another embodiment of the invention in which an EEPROM is provided as a nonvolatile memory to/from which data can be written/read from the outside on a chip of a volatile memory such as an SDRAM will be described with reference to FIG. 14.

Figure 14:
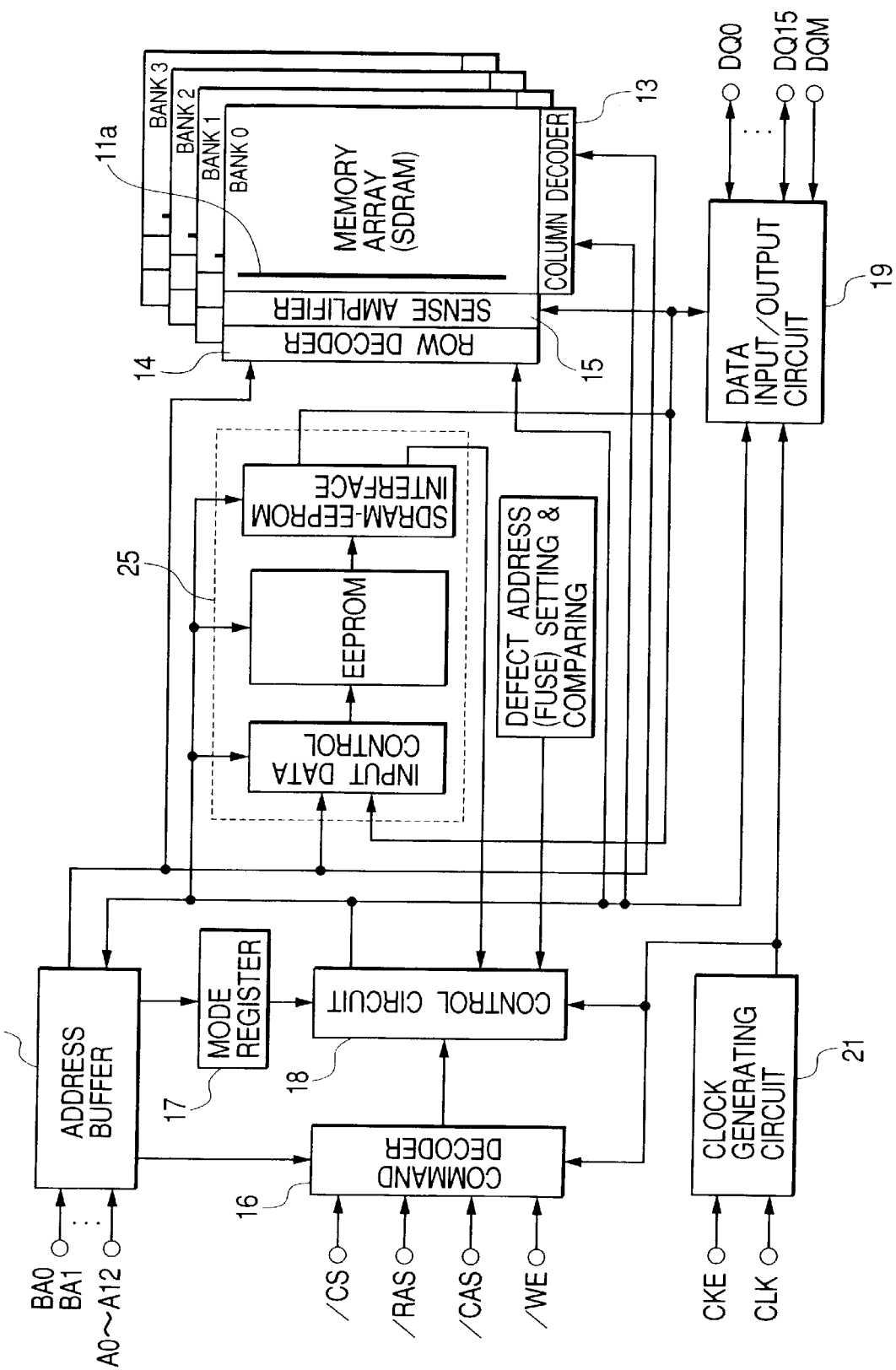
FIG. 14 is a block diagram showing a case in which an EEPROM is provided as a nonvolatile memory to/from which data can be written/read from the outside in a part of a volatile memory such as an SDRAM in accordance with another embodiment of the invention.

The memory of FIG. 14 has substantially the same configuration as that of the memory of FIG. 1. Reference numeral 11 denotes a volatile memory array, such as a RAM cell, and 25 indicates a nonvolatile EEPROM section including the EEPROM array 210 shown in FIG. 6. Reference numeral 20B denotes a defect address setting and comparing circuit including a fuse for setting a defect address in the memory array 11 in a manner similar to FIG. 1. The embodiment of FIG. 14 is different from that of FIG. 1 in that data in the EEPROM section 25 is transferred to and stored in a predetermined area 11A (hereinbelow, called a cache area) in the memory array 11 and, on the contrary, data in the cache area 11A in the memory array 11 can be transferred to and stored in the EEPROM section 25.

The data transfer can be performed by using the command system described in the foregoing embodiment and using the EEPROM write command EPPRG, the active command ACTV, and the like. In this case, the first data writing operation may be performed by using a part of an address in a manner similar to the first embodiment. It is also possible to store the write data in the cache area 11A in the memory array 11 and then transfer and store the write data in the EEPROM section 25.

The memory of the embodiment is effective when the data stored in the EEPROM section 25 is frequently referred to or rewritten. Particularly, in a system in which data rewriting is frequently performed, the following method can be used. Data stored in the EEPROM section 25 is transferred and stored in the cache area 11A at the time of turn-on of power, the cache area 11A is normally accessed; and, when the power source is interrupted, that is, the system is finished, the data in the cache area 11A is transferred to the EEPROM section 25 and stored Ln a lump. Specifically, the writing/reading operation to/from the EEPROM is performed in the cache area using the memory cell in the SDRAM in normal times, thereby making an access from the outside quite the same as an access to the SDRAM. The time required to read/write data to/from the EEPROM section 25 can therefore be shortened, and deterioration in characteristics can be suppressed by decreasing the number of rewriting times of the EEPROM section 25.

The EEPROM section 25 may be connected to the data input/output circuit 19, so that data can be directly written from the outside to the EEPROM section 25 and the data in the EEPROM section 25 can be directly read via the data terminal from the outside.

As a third embodiment of the invention, a memory is provided in which the operation timing of a RAM can be adjusted by using an EEPROM cell.

Figure 15:
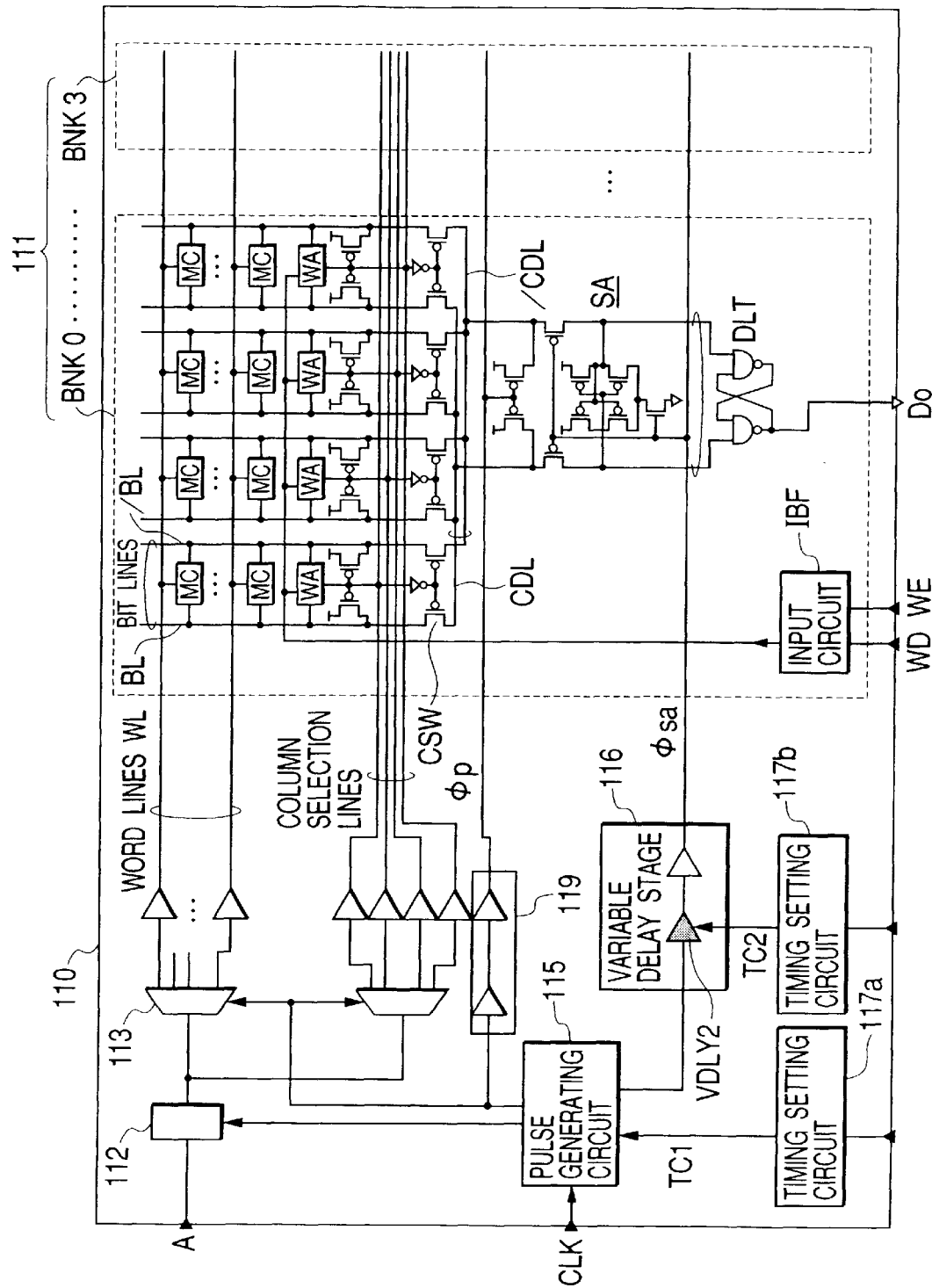
FIG. 15 is a schematic circuit diagram showing an example of a memory circuit capable of adjusting the operation timing of a RAM by using the EEPROM cell in accordance with a third embodiment of the invention.

FIG. 15 shows a specific example of the configuration of a RAM. A RAM 110 of the embodiment includes a memory array 111 in which a plurality of memory cells MC are arranged in the form of a matrix, an address latch circuit 112 for latching an input address signal, a row address decoder 113 for decoding a row address signal and selecting one of word lines WL in the memory array corresponding to the row address signal, a column address decoder 114 for decoding an input column address signal and selecting bit lines BL and /BL in the memory array, a pulse generating circuit 115 for generating a write pulse or the like, a timing circuit 116 for generating an activate signal ($\phi$sa of a sense amplifier in the memory array by delaying the signal generated by the pulse generating circuit 115, timing setting circuits 117a and 117b for setting timing adjustment information to the pulse generating circuit 115 and the timing circuit 116, and a timing circuit 119 for generating a precharge signal $\phi$p for common data lines CDL and /CDL in the memory array on the basis of the signal generated by the pulse generating circuit 115.

The memory array 111 includes a column switch CSW for connecting a selected pair of bit lines in the memory array to the common data lines CDL and /CDL, a sense amplifier SA for amplifying a data signal read from the memory cell onto the common data lines CDL and /CDL, a data latch circuit DLT for latching the read data amplified by the sense amplifier SA, a write amplifier WA for writing data to a selected memory cell on the basis of a read/write control signal WE and write data WD, and an input circuit IBF for capturing the write data WD and the read/write control signal WE.

The timing circuit 116 has, for example, a variable delay circuit DLY. By determining a delay amount in the variable delay circuit DLY in accordance with a signal from the timing setting circuit 117b, the timing of the sense amplifier activate signal $\phi$sa can be adjusted. The pulse generating circuit 115 takes the form of a one-shot pulse generating circuit having the variable delay circuit. By determining a delay amount in the variable delay circuit in accordance with a signal from the timing setting circuit 117a, the write pulse width can be adjusted.

Figure 16A:
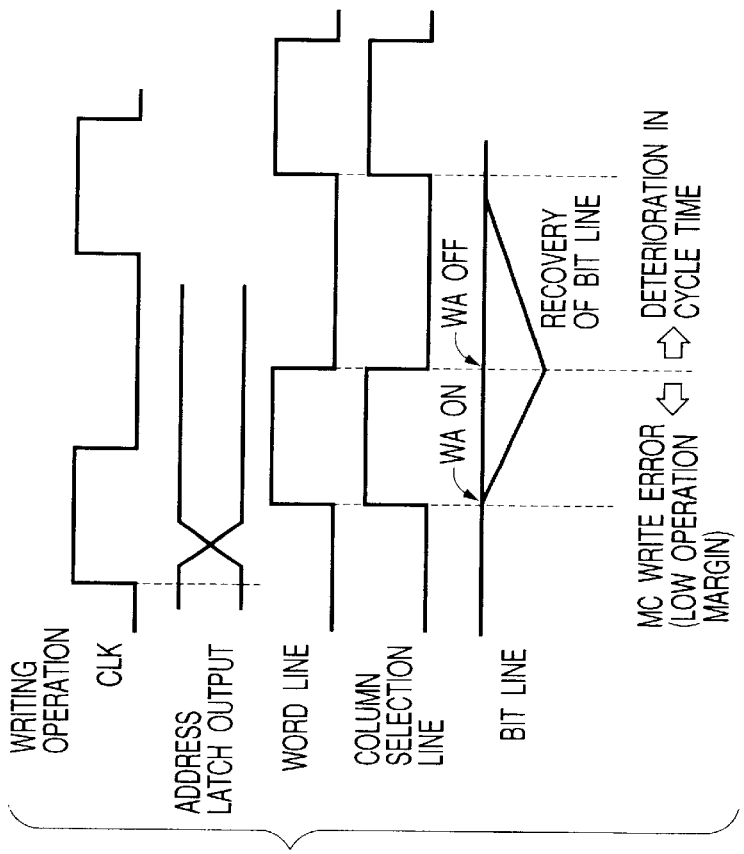
FIGS. 16A and 16B are timing charts showing the operation timings of the memory circuit.

In a RAM as shown in FIG. 15, as illustrated in FIG. 16A, when the word line WL is increased to a selection level, the potential difference between the bit lines BL and /BL starts to be widened. When the activate signal $\phi$sa is activated at a proper timing to start the operation of the sense amplifier SA, the potential difference between the bit lines BL and /BL is amplified, and data of "0" or "1" is determined. In an actual device, an offset voltage or an offset current is generated in the sense amplifier SA due to variations in characteristics of the device. Consequently, if the sense amplifier SA is made active when the potential difference between the bit lines BL and /BL is small, that is, within a short time after the word line is made active, there is the possibility of an erroneous operation in which the potential difference is amplified in the opposite direction. On the other hand, when the margin is increased by delaying the timing of activating the sense amplifier SA to avoid an erroneous operation with reliability, it causes deterioration in the reading time.

It is, therefore, desirable to adjust the timing of activating the sense amplifier SA in accordance with the performances of each RAM. In a RAM macro cell of the embodiment, as described above, the timing of the sense amplifier activate signal $\phi$sa can be adjusted by using the timing setting circuit 117b including the EEPROM. The adjustment is performed specifically as follows. For example, first, data for generating a proper adjustment signal TC2 is written into the timing setting circuit 117, and a test is carried out. The operation is repeated while shifting the timing to thereby detect the optimum timing. By setting the data by which such a timing can be obtained in the timing setting circuit 117b, the timing adjustment of the sense amplifier activate signal $\phi$sa can be performed automatically.

Figure 16B:
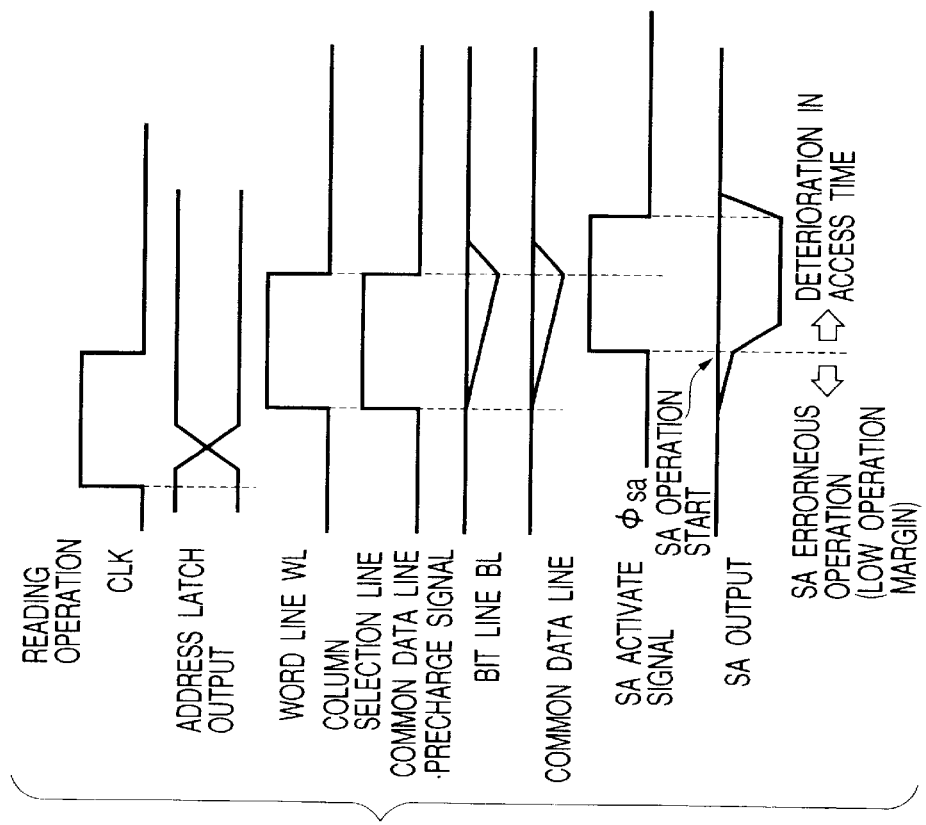

The adjustment of the write pulse width will now be described. The operation of writing data to the selected memory cell by the write amplifier WA has to be finished while the word line WL is at the selection level. As easily understood from FIG. 16B, assuming now that the write pulse width is short and the word line WL changes to a non-selection level before the data writing to the selected memory cell by the write amplifier WA is finished, in the case of inverting stored data, there is the possibility that a data input terminal of the selected memory cell will be closed before the stored data is inverted, and writing is performed after that. On the contrary, when the write pulse is set to be long to increase the margin too much, since the cycle time is determined by clocks, the time until the start of the next operation becomes short, the time of precharging by the timing circuit 119 becomes short, the next operation starts before bit lines recover to a desired level, and this causes an erroneous operation. When the cycle of clocks is increased to avoid the erroneous operation so as to set a long cycle time, the performance of the RAM deteriorates.

It is therefore desirable to adjust the write pulse width in accordance with the performance of each RAM. The RAM of the embodiment is constructed so that such adjustment of the write pulse width is performed by using the timing setting circuit 117a as described above. Since a specific adjustment method is similar to the timing adjustment of the activate signal φsa of the sense amplifier, its detailed description will not be repeated.

In the embodiment, the timing of the activate signal φsa of the sense amplifier and the write pulse width have been explained as targets of timing adjustment. The timing of a signal in a memory to be adjusted is not limited to the above, but may be, for example, (1) a non-selection timing of a Y-axis selection signal of a column switch or the like, (2) an equalize start timing of a bit line, a sense amplifier, a data path at the post stage of the sense amplifier, and the like, (3) an equalize end timing of the bit line, sense amplifier, data path at the post stage of the sense amplifier, and the like, (4) timings of (4) and (5) after the writing and after the reading, respectively, (5) set-up time and hold time of the address latch circuit 112, and (6) a latch timing of the output data latch DLT. By making all or some of the above timings adjustable, the processing speed of the memory can be further increased by shortening the memory cell access time and the cycle time.

The invention achieved by the inventor of the present invention has been specifically described above on the basis of the preferred embodiments. Obviously, the invention is not limited .to the foregoing embodiments but can be variously changed in a range without departing from the gist of the invention. For example, as a circuit in a defect address setting circuit or a setting circuit for adjusting an activating timing of a sense amplifier or the like, in place of the EEPROM cell having the configuration as shown in FIG. 7, a general nonvolatile memory device constructed by a MOSFET of a two-layer gate structure having a floating gate and a control gate may be used.

Other than the defect address setting circuit and the timing setting circuit, the invention can also be applied to a hardware setting circuit for switching the major function or specification of the chip, which is conventionally prepared as a bonding option or the like and is irreversible, for example, setting of the system in an SDPAM which can operate in both an SDR (single data rate) system and a DDR (double data rate) system. Further, in the embodiment, the case in which the invention is applied to a semiconductor memory having two kinds of storages of the SDRAM and the EEPROM having memory cells of different configurations has been described. The invention can also be applied to the case where a semiconductor memory has three or more kinds of storages of different configurations.

Although the case of applying the invention achieved by the inventor mainly to a device in which a nonvolatile memory, such as an EEPROM, is provided for a volatile semiconductor memory, such as an SDRAM, in the industrial field of utilization has been described as the background of the invention, the invention is not limited to this case, but can be applied to a general semiconductor integrated circuit having therein two or more kinds of memory circuits.

Effects obtained by representative aspects and features of the invention disclosed in this application will be briefly described as follows.

Since two or more storages constructed by memory cells of different configurations can be accessed by the same command, the plurality of storages can be separately operated without providing a new external control terminal. In the case where the semiconductor integrated circuit has therein a memory circuit such as a RAM, even in a state where the chip is sealed in a package and further mounted on a board or module, defect address information can be easily written to the memory circuit. Thus, a semiconductor integrated circuit having an improved yield obtained by repairing a defective bit in the memory circuit and which can operate at higher speed by adjusting the operation timing of the circuit and increasing the operation margin can be provided.

What is claimed is:

1. A semiconductor integrated circuit comprising:
    a first storage having a memory cell of a first configuration;
    a second storage having a memory cell of a second configuration;
    a plurality of control terminals for receiving a plurality of control signals; and
    a plurality of address terminals,
    wherein a first command for instructing an operation of said first storage and a second command for instructing an operation of said second storage are specified by a combination of said control signals, and
    wherein said first command and said second command have a same code.

2. A semiconductor integrated circuit comprising:
    a first storage having a memory cell of a first configuration;
    a second storage having a memory cell of a second configuration;
    a plurality of control terminals for receiving a plurality of control signals; and
    a plurality of address terminals,
    wherein a first command for instructing an operation of said first storage and a second command for instructing an operation of said second storage are specified according to a combination of said plurality of control signals and one or more of signals supplied to said address terminals, and
    wherein said first command and said second command have a same code as one of said plurality of control signals.

3. A semiconductor integrated circuit according to claim 2, wherein said first command and said second command have a different code as to said one or more of signals supplied to said address terminals.

4. A semiconductor integrated circuit according to claim 2 or 3, wherein information stored in said second storage is defect address information of said first storage.

5. A semiconductor integrated circuit according to claim 2 or 3, wherein information stored in said second storage is information regarding an operation timing of said first storage.

6. A semiconductor integrated circuit according to claim 2 or 3, wherein the memory cell of said second configuration is a nonvolatile memory cell, and a booster circuit for increasing a normal source voltage to thereby generate a high voltage to be used at the time of writing data to said nonvolatile memory is provided.

7. A semiconductor integrated circuit according to claim 6, wherein at the time of writing or erasing data to/from said nonvolatile memory, time necessary for the writing or erasing operation is determined by the number of repeating times of a command which does not generate a new operation.

8. A semiconductor integrated circuit according to claim 2 or 3, further comprising a mode register for setting an operation mode designated by a signal supplied from the outside, wherein a command determined by signals supplied to said control terminals in said first combination or said second combination is a command for instructing setting of a mode to said mode register.

9. A semiconductor integrated circuit comprising:

a dynamic memory;

a nonvolatile memory;

a plurality of first input terminals for receiving a plurality of control signals; and a plurality of second input terminals for receiving a plurality of address signals, wherein each of a first command for controlling said dynamic memory and a second command for controlling said nonvolatile memory are specified by signals supplied to said plurality of first input terminals and one or more signals supplied to one or more of said plurality of second input terminals, and a code of said plurality of control signals in said first command is common to that in said second command, and said one or more signals supplied to one or more of said plurality of second input terminals in said first command and that in said second command are different from each other.

10. A semiconductor integrated circuit according to claim 9, wherein whether said common command is for the dynamic memory or the nonvolatile memory is discriminated by said one or more signals.

11. A semiconductor integrated circuit according to claim 10, wherein said common command is a mode register set command to said dynamic memory.

12. A semiconductor circuit system in which a first semiconductor device and a second semiconductor device which can access a storage included in said first semiconductor device are mounted on a single printed wiring board, wherein said storage includes a volatile memory and a nonvolatile memory, said first semiconductor device further comprises:

a plurality of first input terminals for receiving a plurality of control signals; and a plurality of second input terminals for receiving a plurality of address signals, each of a first command for controlling said volatile memory and a second command for controlling said nonvolatile memory is specified by signals supplied to said plurality of first input terminals and one or more signals supplied to one or more of said plurality of second input terminals, and a code of said plurality of control signals is common to said first command and said second command, and said one or more signals supplied to one or more of said plurality of second input terminals for said first command and that for said second command are different from each other.

* * * * *